United States Patent
Oshima et al.

(10) Patent No.: US 11,489,462 B2
(45) Date of Patent: Nov. 1, 2022

(54) PIEZOELECTRIC MATERIAL, PIEZOELECTRIC ELEMENT, AND ELECTRONIC EQUIPMENT

(71) Applicants: CANON KABUSHIKI KAISHA, Tokyo (JP); FUJI CHEMICAL CO., LTD., Osaka (JP)

(72) Inventors: Kanako Oshima, Tokyo (JP); Miki Ueda, Tokyo (JP); Takanori Matsuda, Chofu (JP); Makoto Kubota, Yokohama (JP); Hisato Yabuta, Machida (JP); Fumio Uchida, Daito (JP); Hiroki Imai, Nakatsugawa (JP); Kenji Maeda, Hirakata (JP); Chiemi Shimizu, Hirakata (JP)

(73) Assignees: CANON KABUSHIKI KAISHA, Tokyo (JP); FUJI CHEMICAL CO., LTD., Osaka (JP)

( * ) Notice: Subject to any disclaimer, the term of this patent is extended or adjusted under 35 U.S.C. 154(b) by 469 days.

(21) Appl. No.: 16/775,523

(22) Filed: Jan. 29, 2020

(65) Prior Publication Data
US 2020/0169190 A1 May 28, 2020

Related U.S. Application Data

(63) Continuation of application No. PCT/JP2018/028789, filed on Aug. 1, 2018.

(30) Foreign Application Priority Data

Aug. 4, 2017 (JP) .............................. JP2017-151938

(51) Int. Cl.
*H02N 2/10* (2006.01)
*B41J 2/14* (2006.01)
(Continued)

(52) U.S. Cl.
CPC .......... *H02N 2/103* (2013.01); *B41J 2/14233* (2013.01); *C04B 35/495* (2013.01);
(Continued)

(58) Field of Classification Search
CPC ........ H02N 2/103; H02N 2/106; H02N 2/163; B41J 2/14233; C04B 35/495;
(Continued)

(56) References Cited

U.S. PATENT DOCUMENTS 8,518,290 B2   8/2013   Watanabe et al.
8,663,493 B2   3/2014   Matsuda et al.
(Continued)

FOREIGN PATENT DOCUMENTS

JP   2006-327863 A   12/2006
JP   2007-137704 A    6/2007
(Continued)

OTHER PUBLICATIONS

IP.com search (Year: 2022).*
(Continued)

*Primary Examiner* — Lisa Solomon
(74) *Attorney, Agent, or Firm* — Venable LLP

(57) ABSTRACT

Provided is a lead-free piezoelectric material reduced in dielectric loss tangent, and achieving both a large piezoelectric constant and a large mechanical quality factor. A piezoelectric material according to at least one embodiment of the present disclosure is a piezoelectric material including a main component formed of a perovskite-type metal oxide represented by the general formula (1): $Na_{x+s(1-y)}(Bi_w Ba_{1-s-w})_{1-y}Nb_y Ti_{1-y}O_3$ (where $0.84 \leq x \leq 0.92$, $0.84 \leq y \leq 0.92$, $0.002 \leq (w+s)(1-y) \leq 0.035$, and $0.9 \leq w/s \leq 1.1$), and a Mn component, wherein the content of the Mn is 0.01 mol % or more and 1.00 mol % or less with respect to the perovskite-type metal oxide.

16 Claims, 9 Drawing Sheets

(51) Int. Cl.
  *C04B 35/495*  (2006.01)
  *C04B 35/64*  (2006.01)
  *H01L 41/047*  (2006.01)
  *H01L 41/083*  (2006.01)
  *H01L 41/09*  (2006.01)
  *H01L 41/187*  (2006.01)
  *H01L 41/273*  (2013.01)
  *H04N 5/217*  (2011.01)

(52) U.S. Cl.
  CPC .......... *C04B 35/64* (2013.01); *H01L 41/0471* (2013.01); *H01L 41/083* (2013.01); *H01L 41/0973* (2013.01); *H01L 41/1871* (2013.01); *H01L 41/1873* (2013.01); *H01L 41/273* (2013.01); *H04N 5/2171* (2013.01); *C04B 2235/3236* (2013.01); *C04B 2235/3255* (2013.01); *C04B 2235/3263* (2013.01); *C04B 2235/768* (2013.01)

(58) Field of Classification Search
  CPC .... C04B 2235/3236; C04B 2235/3255; C04B 2235/3263; C04B 2235/768; C04B 2235/3201; C04B 2235/3215; C04B 2235/3232; C04B 2235/3251; C04B 2235/3298; C04B 2235/6567; C04B 2235/72; C04B 2235/77; C04B 2235/785; C04B 2235/786; C04B 2235/96; H01L 41/0471; H01L 41/083; H01L 41/0973; H01L 41/1871; H01L 41/1873; H01L 41/273; H01L 41/43; H04N 5/2171
  See application file for complete search history.

(56) References Cited

U.S. PATENT DOCUMENTS

| | | | |
|---|---|---|---|
| 9,496,484 B2 | 11/2016 | Ueda et al. | |
| 9,660,174 B2 | 5/2017 | Murakami et al. | |
| 9,960,343 B2 | 5/2018 | Ueda et al. | |
| 10,516,093 B2 | 12/2019 | Ueda et al. | |
| 2014/0125204 A1 | 5/2014 | Matsuda et al. | |
| 2015/0368162 A1* | 12/2015 | Hayashi | B41J 2/14201 347/68 |
| 2018/0123017 A1 | 5/2018 | Fujii et al. | |
| 2020/0169191 A1 | 5/2020 | Kubota et al. | |
| 2020/0169192 A1 | 5/2020 | Matsuda et al. | |

FOREIGN PATENT DOCUMENTS

| | | |
|---|---|---|
| JP | 2009-227535 A | 10/2009 |
| JP | 2014-62032 A | 4/2014 |
| JP | 2017-17157 A | 1/2017 |
| WO | 2019/026941 A1 | 2/2019 |
| WO | 2019/026960 A1 | 2/2019 |
| WO | 2019/026964 A1 | 2/2019 |

OTHER PUBLICATIONS

International Preliminary Report on Patentability in International Application No. PCT/JP2018/028789 (dated Feb. 2020).
U.S. Appl. No. 16/775,561, filed Jan. 29, 2020.
U.S. Appl. No. 16/775,542, filed Jan. 29, 2020.
Saburo Nagakura et al. (ed.), Iwanami Physicochemical Dictionary, 5th Edition, p. 1268-1269 (Iwanami Shoten, Publishers; Feb. 20, 1998).
International Search Report in International Application No. PCT/JP2018/028789 (dated Oct. 2018).

* cited by examiner

PIEZOELECTRIC MATERIAL, PIEZOELECTRIC ELEMENT, AND ELECTRONIC EQUIPMENT

CROSS-REFERENCE TO RELATED APPLICATIONS

This application is a Continuation of International Patent Application No. PCT/JP2018/028789, filed Aug. 1, 2018, which claims the benefit of Japanese Patent Application No. 2017-151938, filed Aug. 4, 2017, both of which are hereby incorporated by reference herein in their entirety.

BACKGROUND OF THE INVENTION

Field of the Invention

The present disclosure relates to a piezoelectric material, and more particularly, to a piezoelectric element using a piezoelectric material free of lead. The present disclosure also relates to an electronic equipment using the piezoelectric element.

Description of the Related Art

A perovskite-type metal oxide of an $ABO_3$ type, such as lead zirconate titanate (hereinafter referred to as "PZT"), which contains lead, is a typical piezoelectric material. A piezoelectric element obtained by forming electrodes on a surface of a piezoelectric material is used in a variety of piezoelectric devices and electronic equipments, such as an actuator, an oscillator, a sensor, and a filter.

However, PZT contains lead as an A site element, and hence its influence on an environment is regarded as a problem. For example, a lead component in a discarded piezoelectric material may elute into soil to adversely affect an ecosystem. Accordingly, various investigations have been made on a piezoelectric material free of lead (hereinafter referred to as "lead-free piezoelectric material").

An example of the lead-free piezoelectric material is a solid solution of sodium niobate ($NaNbO_3$) and barium titanate ($BaTiO_3$) (hereinafter referred to as "NN-BT"). NN-BT is a potassium-free material substantially free of potassium, which is responsible for poor sinterability and low moisture resistance, and hence enables stable element manufacture with less variations in properties. In addition, also when NN-BT is used for a piezoelectric device, there is an advantage in that hardly any remarkable fluctuation occurs in performance depending on a use temperature by virtue of the absence of phase transition of a crystal structure in a use temperature range of the device (e.g., from 0° C. to 80° C.).

For example, in Japanese Patent Application Laid-Open No. 2009-227535, there is a disclosure that a large piezoelectric constant and a large mechanical quality factor are obtained by adding cobalt oxide (CoO) to NN-BT. However, there is a problem in that the resultant material has a large dielectric loss tangent, which causes an increase in consumed electric power in driving as a piezoelectric element.

The present disclosure has been made in order to solve such problem, and provides a lead-free and potassium-free piezoelectric material reduced in dielectric loss tangent, and achieving both a large piezoelectric constant and a large mechanical quality factor, and a manufacturing method therefor. The present disclosure also provides a piezoelectric element and an electronic equipment each using the piezoelectric material.

SUMMARY OF THE INVENTION

A piezoelectric material according to at least one embodiment of the present disclosure, which solves the above-mentioned problem, is a piezoelectric material including a main component formed of a perovskite-type metal oxide represented by the following general formula (1): $Na_{x+s(1-y)}(Bi_wBa_{1-s-w})_{1-y}Nb_yTi_{1-y}O_3$ (where $0.84 \leq x \leq 0.92$, $0.84 \leq y \leq 0.92$, $0.002 \leq (w+s)(1-y) \leq 0.035$, and $0.9 \leq w/s \leq 1.1$), and a Mn component, wherein the content of the Mn is 0.01 mol % or more and 1.00 mol % or less with respect to the perovskite-type metal oxide.

A manufacturing method for a piezoelectric material according to at least one embodiment of the present disclosure includes firing mixed raw material powder including sodium niobate, barium titanate, and sodium bismuth titanate each having a perovskite-type structure to obtain a sintered body of the piezoelectric material.

A piezoelectric element according to at least one embodiment of the present disclosure is a piezoelectric element including: a first electrode; a piezoelectric material portion; and a second electrode, wherein a piezoelectric material for forming the piezoelectric material portion is the piezoelectric material.

An electronic equipment according to at least one embodiment of the present disclosure includes the piezoelectric element.

Further features of the present disclosure will become apparent from the following description of exemplary embodiments with reference to the attached drawings.

DESCRIPTION OF THE EMBODIMENTS

Figure 1:
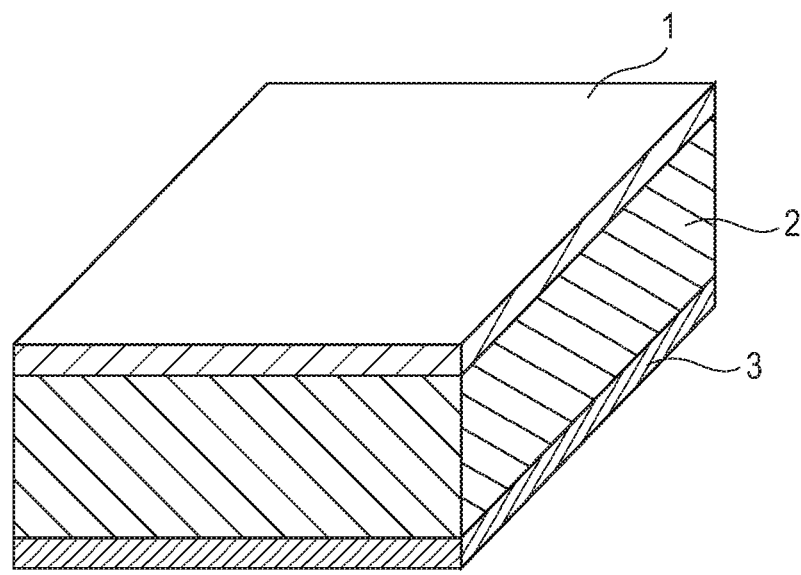
FIG. 1 is a schematic view for illustrating the configuration of a piezoelectric element according to at least one embodiment of the present disclosure.

Embodiments of the present disclosure are hereinafter described.

The present disclosure provides a lead-free piezoelectric material using NN-BT as a basic configuration, having a satisfactory piezoelectric constant and a satisfactory mechanical quality factor, and having a small dielectric loss tangent. The piezoelectric material according to at least one embodiment of the present disclosure can be utilized for various applications, such as a capacitor, a memory, and a sensor, through the utilization of its properties as a dielectric material.

A piezoelectric material according to at least one embodiment of the present disclosure is a piezoelectric material including a main component formed of a perovskite-type metal oxide represented by the following general formula (1): $Na_{x+s(1-y)}(Bi_wBa_{1-s-w})_{1-y}Nb_yTi_{1-y}O_3$ General formula (1) (where $0.84 \leq x \leq 0.92$, $0.84 \leq y \leq 0.92$, $0.002 \leq (w+s)(1-y) \leq 0.035$, and $0.9 \leq w/s \leq 1.1$), and a Mn component, wherein the content of the Mn is 0.01 mol % or more and 1.00 mol % or less with respect to the perovskite-type metal oxide. Accordingly, a sufficient piezoelectric constant and a satisfactory mechanical quality factor are obtained, and besides, the dielectric loss tangent can be significantly reduced.

In at least one embodiment of the present disclosure, the perovskite-type metal oxide refers to a metal oxide having a perovskite-type structure (sometimes referred to as "perovskite structure") that is ideally a cubic structure as described in Iwanami Rikagaku Men 5th Edition (published by Iwanami Shoten on Feb. 20, 1998). The metal oxide having a perovskite-type structure is generally represented by the chemical formula of $ABO_3$. In the perovskite-type metal oxide, elements A and B occupy specific positions in a unit cell, which are called an A site and a B site, respectively, in the form of ions. For example, in the case of a cubic unit cell, the A site element occupies the corners of a cubic, and the B site element occupies a body-centered position of the cubic. An O element occupies the face-centered positions of the cubic as an anion of oxygen. The A site element is 12-coordinate, and the B site element is 6-coordinate. When the coordinates of each of the A site element, the B site element, and the O element slightly shift from a symmetrical position in a unit cell, the unit cell of the perovskite-type structure is distorted to become a crystal system such as a tetragonal, rhombohedral, or orthorhombic crystal system.

The perovskite-type metal oxide represented by the general formula (1) means that metal elements positioned at the A site are Na, Ba, and Bi, and metal elements positioned at the B site are Ti and Nb. However, part of Na, Ba, and Bi may be positioned at the B site. Similarly, part of Ti and Nb may be positioned at the A site.

The molar ratio of the B site elements to the O element in the general formula (1) is constant at 1:3, but a case in which the ratio of element amounts slightly deviates therefrom (e.g., from 1.00:2.94 to 1.00:3.06) is also encompassed in the scope of the present disclosure as long as the metal oxide has a perovskite-type structure as a primary phase. That the metal oxide has a perovskite-type structure may be judged based on, for example, structural analysis by X-ray diffraction or electron beam diffraction.

The piezoelectric material according to at least one embodiment of the present disclosure can have its dielectric loss tangent lowered while maintaining a satisfactory piezoelectric constant and a satisfactory mechanical quality factor, by substituting part of barium titanate of NN-BT of the related art with sodium bismuth titanate (hereinafter referred to as "BNT") and solid-dissolving Mn. By virtue of substituting part of barium titanate of NN-BT with BNT, the piezoelectric material according to at least one embodiment of the present disclosure forms a crystal having a lower symmetry than NN-BT. The piezoelectric material according to at least one embodiment of the present disclosure with the lowered symmetry of the crystal hardly causes polarization switching and domain wall motion of a ferroelectric 90° domain. As a result, as compared to NN-BT, the mechanical quality factor is increased and the dielectric loss tangent is lowered while a comparable piezoelectric constant is obtained. The piezoelectric material according to at least one embodiment of the present disclosure obtains a sufficiently reduced dielectric loss tangent and a satisfactory mechanical quality factor by virtue of further solid-dissolving Mn.

Raw materials for the piezoelectric material according to at least one embodiment of the present disclosure are not particularly limited, but it is desired that mixed raw material powder of sodium niobate, barium titanate, and sodium bismuth titanate each having a perovskite-type structure be fired to manufacture a sintered body of the piezoelectric material.

When sodium bismuth titanate (rhombohedral crystal) is used as a raw material, the symmetry of the crystal of the piezoelectric material is easily lowered. As a result, the polarization switching and domain wall motion of the 90° domain of the piezoelectric material are more suppressed, and hence higher effects of increasing the mechanical quality factor and lowering the dielectric loss tangent are obtained.

In addition, when the mixed raw material powder having a perovskite-type structure is fired, a sintered body containing a smaller amount of a phase other than the perovskite-type structure (impurity phase) can be obtained. As a result, a more satisfactory mechanical quality factor and a more satisfactory insulation property are obtained, and besides, the dielectric loss tangent is lowered more.

The primary phase (51 wt % or more) of the piezoelectric material according to at least one embodiment of the present disclosure is a perovskite-type structure. When the primary phase is a perovskite structure, a satisfactory piezoelectric constant can be obtained. It is more preferred that 90 wt % or more of the piezoelectric material be a perovskite-type structure, and it is still more preferred that the piezoelectric material be formed of a single phase of a perovskite-type structure.

Symbol "x" represents the molar ratio of Na derived from sodium niobate to the sum of the A site elements (Na, Bi, and Ba) in the case where the general formula (1) is regarded as a solid solution of sodium niobate, barium titanate, and sodium bismuth titanate. In the general formula (1), the value of "x" is $0.84 \leq x \leq 0.92$. When "x" is less than 0.84, the Curie temperature of the piezoelectric material becomes less than 200° C., and moreover, a sufficient piezoelectric constant is not obtained. In addition, when "x" is more than 0.92, a sufficient mechanical quality factor is not obtained. A more preferred range of "x" is $0.855 \leq x \leq 0.91$.

The Curie temperature refers to a temperature at or above which the piezoelectricity of the piezoelectric material is lost. Herein, a temperature at which the dielectric constant becomes maximum in the vicinity of a phase transition temperature between a ferroelectric phase and a paraelectric phase is defined as the Curie temperature.

When the piezoelectric material according to at least one embodiment of the present disclosure is driven as a piezoelectric element, in order to prevent the degradation of properties through depolarization due to heat generation at the time of driving, the Curie temperature of the piezoelectric material according to at least one embodiment of the present disclosure is preferably 200° C. or more, more preferably 210° C. or more.

A piezoelectric constant (absolute value $|d_{31}|$ of $d_{31}$) preferred for driving as a piezoelectric element is 50 pm/V or more at room temperature (e.g., 25° C.). A more preferred $|d_{31}|$ is 53 pm/V or more, and a still more preferred $|d_{31}|$ is 55 pm/V or more.

The value of "y", which represents the molar ratio of Nb to the sum of Nb and Ti, is $0.84 \leq y \leq 0.92$. When "y" is 0.84 or more and 0.92 or less, a Curie temperature of 200° C. or more and a satisfactory piezoelectric constant are obtained. When "y" is less than 0.84, the Curie temperature becomes less than 200° C. A piezoelectric material containing Na may lose Na when subjected to high temperature, and hence is preferably subjected to sintering treatment at a temperature of 1,350° C. or less. However, when "y" is more than 0.92, sintering requires high temperature (e.g., 1,360° C. or more). When sintering treatment is performed at high temperature, a large amount of Na is lost, and hence a sufficient density is not obtained. As a result, the piezoelectric constant and the mechanical quality factor are significantly lowered. A more preferred range of "y" is $0.86 \leq y \leq 0.91$.

A mechanical quality factor preferred for suppressing an increase in consumed electric power at the time of the driving of a piezoelectric element is 480 or more at room temperature. A more preferred mechanical quality factor is 500 or more, and a still more preferred mechanical quality factor is 510 or more.

Symbol "w" represents the molar ratio of Bi to the sum of the A site elements (Na, Bi, and Ba). Symbol "s" represents the molar ratio of Na derived from sodium bismuth titanate to the sum of the A site elements (Na, Bi, and Ba) in the case where the general formula (1) is regarded as a mixture of sodium niobate, barium titanate, and sodium bismuth titanate.

The ratio $(w+s)(1-y)$ represents the molar ratio of the sum of Bi and Na derived from sodium bismuth titanate to the sum of the A site elements (Na, Bi, and Ba) in the case where the general formula (1) is regarded as a mixture of sodium niobate, barium titanate, and sodium bismuth titanate. The range of the value of $(w+s)(1-y)$ is $0.002 \leq (w+s)(1-y) \leq 0.035$. When $(w+s)(1-y)$ is less than 0.002, the symmetry of the crystal is not sufficiently lowered, and hence the dielectric loss tangent is increased to increase the consumed electric power at the time of the driving of a device. In addition, a sufficient mechanical quality factor is not obtained. When $(w+s)(1-y)$ is more than 0.035, the dielectric loss tangent is increased, and moreover, a sufficient mechanical quality factor is not obtained. A more preferred range of $(w+s)(1-y)$ is $0.002 \leq (w+s)(1-y) \leq 0.30$.

The ratio w/s represents the ratio of a Bi amount "w" to a Na amount "s" derived from sodium bismuth titanate in the case where the general formula (1) is regarded as a mixture of sodium niobate, barium titanate, and sodium bismuth titanate. In the general formula (1), the range of the value of w/s is $0.9 \leq w/s \leq 1.1$. When w/s is less than 0.9 or more than 1.1, the dielectric loss tangent is increased, and besides, the insulation property becomes insufficient.

The dielectric loss tangent of the piezoelectric material at room temperature is preferably less than 0.70%. When the dielectric loss tangent at room temperature is less than 0.70%, the consumed electric power can be sufficiently suppressed at the time of the driving of a piezoelectric element. A more preferred dielectric loss tangent at room temperature is less than 0.65%, and a still more preferred dielectric loss tangent is less than 0.60%.

The insulation property may be evaluated by measuring a resistivity. The resistivity of the piezoelectric material at room temperature is preferably 10 GΩ·cm or more ("G" represents 10 to the power of 9). When the resistivity is 10 GΩ·cm or more, polarization can be performed with a high electric field (e.g., 2.0 kV/mm or more), and hence a satisfactory piezoelectric constant is obtained. A more preferred resistivity at room temperature is 50 GΩ·cm or more, a still more preferred resistivity is 100 GΩ·cm or more, and a particularly preferred resistivity is 500 GΩ·cm or more.

The piezoelectric material according to at least one embodiment of the present disclosure contains 0.01 mol % or more and 1.00 mol % or less of Mn with respect to the perovskite-type metal oxide represented by the general formula (1). When the content of Mn is less than 0.01 mol % or more than 1.00 mol %, the dielectric loss tangent is significantly increased, and besides, the insulation property becomes insufficient. A more preferred Mn amount is 0.05 mol % or more and 0.5 mol % or less.

The piezoelectric material according to at least one embodiment of the present disclosure has an appropriate value of $(w+s)(1-y)$ and an appropriate content of Mn, and hence has a particularly satisfactory mechanical quality factor and a significantly reduced dielectric loss tangent.

By virtue of substituting part of barium titanate of NN-BT with BNT, the piezoelectric material according to at least one embodiment of the present disclosure forms a crystal having a lower symmetry than NN-BT. The perovskite-type metal oxide of the piezoelectric material according to at least one embodiment of the present disclosure has a unit cell having a structure containing two or more oxygen octahedra, and specifically, has a P4bm structure. The piezoelectric material according to at least one embodiment of the present disclosure with the lowered symmetry of the crystal hardly causes polarization switching and domain wall motion of a ferroelectric 90° domain. As a result, as compared to NN-BT, the dielectric loss tangent is lowered and the mechanical quality factor is increased. The symmetry of the crystal of the piezoelectric material may be identified from an X-ray diffraction pattern.

When the largest peak intensity in the 2θ range of from 44° to 48° in the case where the piezoelectric material is powdered and subjected to X-ray diffraction measurement of 2θ-θ with Cu—Kα rays at room temperature is represented by I1 and the next largest peak intensity therein is represented by I2, if the largest peak is located on a wide-angle side and a relationship of $1.1 \leq I1/I2 \leq 1.3$ is satisfied, the piezoelectric material is in a state in which its crystal symmetry is sufficiently lowered, and hence a larger mechanical quality factor is obtained.

Raw materials for the piezoelectric material according to at least one embodiment of the present disclosure are not particularly limited, but it is preferred that mixed raw material powder of sodium niobate, barium titanate, and sodium bismuth titanate each having a perovskite-type structure be fired to manufacture a sintered body of the piezoelectric material. It is considered that the lowering of the symmetry of the crystal is caused by the positioning of Bi, which has a smaller ionic radius than Ba, at the A site. When sodium bismuth titanate (rhombohedral crystal) is used as a raw material, Bi is easily positioned at the A site, and the symmetry of the crystal of the piezoelectric material is easily lowered. As a result, the polarization switching of the 90° domain of the piezoelectric material is suppressed more, and hence the dielectric loss tangent can be lowered more and the mechanical quality factor can be increased more.

The piezoelectric material according to at least one embodiment of the present disclosure obtains a sufficiently reduced dielectric loss tangent and a satisfactory mechanical quality factor by virtue of further solid-dissolving Mn. When Mn, which differs in valence from the other constituent elements, is solid-dissolved, a defect dipole is introduced into the crystal to generate an internal electric field. It is considered that the presence of the internal electric field suppresses the vibration of a domain wall due to an external electric field to increase the mechanical quality factor and improve the dielectric loss tangent.

The amount of each of Pb, K, Mg, and Cu contained in the piezoelectric material according to at least one embodiment of the present disclosure is preferably 1,000 ppm or less.

In the case where the amount of the Pb component contained in the piezoelectric material is 1,000 ppm or less, even when, for example, the piezoelectric material, the piezoelectric element, or an electronic equipment using the piezoelectric material or the piezoelectric element is discarded to be exposed to acid rain or left in a severe environment, the adverse effects of the Pb component in the piezoelectric material on the environment can be reduced. In addition, the case in which the amount of the Pb component contained in the piezoelectric material is 1,000 ppm or less is preferred because the mechanical quality factor is increased and the dielectric loss tangent is lowered.

A case in which the amount of the K component contained in the piezoelectric material is 1,000 ppm or less is more preferred because the moisture resistance of the piezoelectric material and the efficiency in its high-speed vibration are enhanced. In addition, the case in which the content of the K component in the piezoelectric material is 1,000 ppm or less is more preferred because the dielectric loss tangent is lowered and the insulation resistance is increased.

A case in which the amount of the Mg component contained in the piezoelectric material is 1,000 ppm or less is more preferred because the dielectric loss tangent of the piezoelectric material is lowered and its insulation resistance is increased.

A case in which the amount of the Cu component contained in the piezoelectric material is 1,000 ppm or less is more preferred because the impurity phase in the piezoelectric material is reduced, which is effective for increasing the piezoelectric constant and lowering the dielectric loss tangent.

When a piezoelectric ceramics, which serves as one mode of form of the piezoelectric material according to at least one embodiment of the present disclosure, is to be obtained, a compact before firing is produced. Herein, the ceramics refers to an aggregate (also referred to as bulk body) of crystal grains, a so-called polycrystal, which contains a metal oxide as a basic component and is baked by heat treatment. The ceramics also include ones processed after sintering. The compact refers to a solid substance formed from raw material powder.

The raw material powder preferably has a high purity.

As powders of metal compounds that may be used for the raw material powder, there may be given a Mn compound, a Na compound, a Nb compound, a Ba compound, a Ti compound, and a Bi compound.

Examples of the Mn compound that may be used include manganese oxide and manganese acetate. Examples of the Na compound that may be used include sodium carbonate and sodium niobate. Examples of the Nb compound that may be used include niobium oxide and sodium niobate. Examples of the Ba compound that may be used include barium oxide, barium carbonate, barium oxalate, barium acetate, barium nitrate, and barium titanate. Examples of the Ti compound that may be used include titanium oxide and barium titanate. Examples of the Bi compound that may be used include bismuth oxide and sodium bismuth titanate.

A sintered body of the piezoelectric material may be manufactured by weighing raw material powders for the respective constituent elements of the piezoelectric material to produce mixed powder and firing the mixed powder. On the other hand, when the sintered body of the piezoelectric material is manufactured by firing mixed raw material powder of sodium niobate, barium titanate, and sodium bismuth titanate each having a perovskite-type structure, a more satisfactory mechanical quality factor can be obtained.

As a forming method, there may be given uniaxial pressing, cold isostatic pressing, hot isostatic pressing, slip casting, and extrusion molding. In the production of the compact, granulated powder is preferably used. When the compact using the granulated powder is sintered, there is an advantage in that the crystal grains of the sintered body are likely to have a uniform size distribution.

A method of granulating the raw material powder of the piezoelectric material is not particularly limited. From the viewpoint that the particle diameters of the granulated powder can be made more uniform, a spray drying method is the most preferred granulation method.

Examples of a binder that may be used in the granulation include polyvinyl alcohol (PVA), polyvinyl butyral (PVB), and an acrylic resin. The amount of the binder to be added is preferably from 1 part by weight to 10 parts by weight with respect to the raw material powder of the piezoelectric material, and is more preferably from 2 parts by weight to 7 parts by weight from the viewpoint that the density of the compact increases.

A method of sintering the compact is not particularly limited. Examples of the sintering method include sintering using an electric furnace, sintering using a gas furnace, a conduction heating method, a microwave sintering method, a millimeter-wave sintering method, and hot isostatic pressing (HIP). The electric furnace and the gas furnace for the sintering may each be a continuous furnace or a batch furnace.

A sintering temperature in the sintering method is not particularly limited, but is preferably a temperature at which each compound reacts to cause sufficient crystal growth. A preferred sintering temperature is 1,050° C. or more and 1,350° C. or less from the viewpoint of causing the grain diameter of the piezoelectric material to fall within the range of from 0.2 μm to 50 μm and the viewpoint of suppressing the volatilization of Na. The sintering temperature is more preferably 1,100° C. or more and 1,300° C. or less. A piezoelectric material sintered in the above-mentioned temperature range exhibits a satisfactory insulation property and a satisfactory piezoelectric constant. In order to stabilize the properties of the piezoelectric material to be obtained by the sintering treatment with good reproducibility, it is appropriate that the sintering treatment be performed with the sintering temperature being set constant in the above-mentioned range for 1 hour or more and 48 hours or less. In addition, a sintering method such as a two-stage sintering method may be used, but a method that does not involve an abrupt temperature change is preferred in consideration of productivity.

It is preferred that the piezoelectric material obtained by the sintering treatment be subjected to polishing processing and then subjected to heat treatment at a temperature equal to or higher than the Curie temperature. When the piezoelectric material is subjected to mechanical polishing processing, a residual stress is generated therein, but the heat treatment at a temperature equal to or higher than the Curie temperature relaxes the residual stress, resulting in a more satisfactory piezoelectric property of the piezoelectric material. A specific time period of the heat treatment is not particularly limited, but for example, the heat treatment preferably involves keeping a temperature of 300° C. or more and 500° C. or less for 1 hour or more and 24 hours or less.

The average grain diameter of the crystal grains forming the piezoelectric material according to at least one embodiment of the present disclosure is preferably 0.2 µm or more and 50 µm or less from the viewpoint of achieving both piezoelectricity and processing strength. When the average grain diameter is set to fall within the above-mentioned range, mechanical strength against each of cutting processing and polishing processing can be obtained while sufficient piezoelectricity is secured. A still more preferred range of the average grain diameter is 0.3 µm or more and 20 µm or less. Herein, the average grain diameter means an average equivalent circular diameter. The equivalent circular diameter refers to an "equivalent circular diameter of a projected area" generally called in a microscopic observation method and represents a diameter of a true circle having the same area as a projected area of a crystal grain.

The present disclosure relates to a piezoelectric material, and any form other than the ceramics, such as powder, a monocrystal, a film, or a slurry, may be adopted.

When the piezoelectric material according to at least one embodiment of the present disclosure is used as a film formed on a substrate, it is desired that the thickness of the piezoelectric material be 200 nm or more and 10 µm or less, more preferably 300 nm or more and 3 µm or less. This is because, when the film thickness of the piezoelectric material is set to 200 nm or more and 10 µm or less, a sufficient electromechanical converting function as a piezoelectric element is obtained.

A method of stacking the film is not particularly limited. Examples thereof include chemical solution deposition (CSD), a sol-gel process, metalorganic chemical vapor deposition (MOCVD), sputtering, pulse laser deposition (PLD), hydrothermal synthesis, and aerosol deposition (AD). Of those, chemical solution deposition or sputtering is the most preferred stacking method. The chemical solution deposition or the sputtering can easily increase the area of the film to be formed. It is preferred that the substrate to be used for the piezoelectric material according to at least one embodiment of the present disclosure be a monocrystalline substrate cut and polished along a (001) plane, a (110) plane, or a (111) plane. With the use of a monocrystalline substrate cut and polished along a specific crystal plane, a piezoelectric material film formed on the surface of the substrate can also be strongly oriented in the same direction.

(Piezoelectric Element)

Next, the piezoelectric element according to at least one embodiment of the present disclosure is described.

FIG. 1 is a schematic view for illustrating the configuration of a piezoelectric element according to at least one embodiment of the present disclosure. The piezoelectric element according to at least one embodiment of the present disclosure includes at least a first electrode 1, a piezoelectric material portion 2, and a second electrode 3, wherein a piezoelectric material for forming the piezoelectric material portion 2 is the piezoelectric material according to at least one embodiment of the present disclosure.

The piezoelectric property of the piezoelectric material according to at least one embodiment of the present disclosure may be evaluated by forming the piezoelectric element including at least the first electrode and the second electrode. The first electrode and the second electrode are each formed of a conductive layer having a thickness of from about 5 nm to about 10 µm. A material therefor is not particularly limited, and only needs to be one to be generally used for a piezoelectric element. Examples thereof may include metals, such as Ti, Pt, Ta, Ir, Sr, In, Sn, Au, Al, Fe, Cr, Ni, Pd, Ag, and Cu, and compounds thereof.

Each of the first electrode and the second electrode may be formed of one kind of those materials, or may be obtained by stacking two or more kinds thereof. In addition, the first electrode and the second electrode may be formed of materials different from each other. A manufacturing method for each of the first electrode and the second electrode is not limited. The first electrode and the second electrode may each be formed by baking a metal paste or by sputtering, vapor deposition, or the like. In addition, both the first electrode and the second electrode may be patterned in desired shapes before use.

(Polarization)

It is more preferred that the piezoelectric element have polarization axes aligned in a certain direction. When the polarization axes are aligned in a certain direction, the piezoelectric constant of the piezoelectric element is increased.

A polarization method for the piezoelectric element is not particularly limited. The polarization treatment may be performed in the air or may be performed in silicone oil. A temperature at which the polarization is performed is preferably a temperature of from 60° C. to 150° C. However, optimum conditions slightly vary depending on the composition of the piezoelectric material for forming the element. An electric field to be applied for performing the polarization treatment is preferably from 800 V/mm to 7.0 kV/mm.

(Resonance-Antiresonance Method)

The piezoelectric constant, mechanical quality factor, and dielectric loss tangent (also called dielectric loss) of the piezoelectric element may be determined by calculation, from the measurement results of a resonance frequency and an antiresonance frequency, which are obtained with a commercially available impedance analyzer, based on the standard of Japan Electronics and Information Technology Industries Association (JEITA EM-4501). This method is hereinafter referred to as resonance-antiresonance method.

(Multilayered Piezoelectric Element)

Next, a multilayered piezoelectric element serving as the piezoelectric element according to at least one embodiment of the present disclosure is described.

In the multilayered piezoelectric element according to at least one embodiment of the present disclosure, the piezoelectric material portion includes at least one internal electrode, and the piezoelectric element has a multilayered structure in which piezoelectric material layers each formed of the piezoelectric material and the at least one internal electrode in a form of a layer are alternately stacked.

Figure 2A:
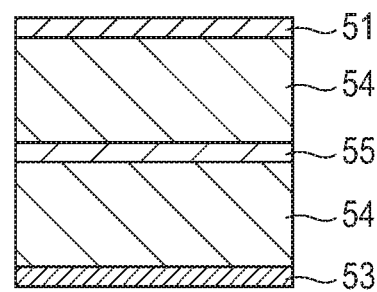
FIG. 2A is a schematic cross-sectional view for illustrating the configuration of a multilayered piezoelectric element according to at least one embodiment of the present disclosure.
Figure 2B:
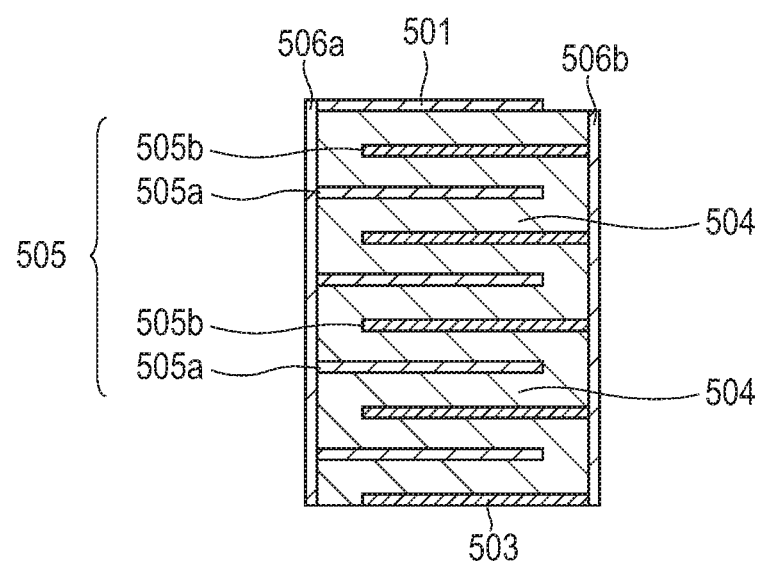
FIG. 2B is a schematic cross-sectional view for illustrating the configuration of a multilayered piezoelectric element according to at least one embodiment of the present disclosure.

FIG. 2A and FIG. 2B are each a schematic cross-sectional view for illustrating the configuration of a multilayered piezoelectric element according to at least one embodiment of the present disclosure. The multilayered piezoelectric element according to at least one embodiment of the present disclosure includes piezoelectric material layers 54, 504, and an electrode layer including an internal electrode 55, 505, which are alternately stacked. In the multilayered piezoelectric element, the piezoelectric material layers 54, 504 are each formed of the above-mentioned piezoelectric material. The electrode layer may include external electrodes, such as a first electrode 51, 501 and a second electrode 53, 503, in addition to the internal electrode 55, 505.

FIG. 2A is an illustration of the configuration of the multilayered piezoelectric element according to at least one embodiment of the present disclosure in which two layers of the piezoelectric material layers 54 and one layer of the internal electrode 55 are alternately stacked, and the multilayered structure is sandwiched between the first electrode 51 and the second electrode 53. As illustrated in FIG. 2B, the numbers of the piezoelectric material layers and the internal electrodes may be increased, and the numbers of the layers are not limited. In the multilayered piezoelectric element of FIG. 2B, nine layers of the piezoelectric material layers 504 and eight layers of the internal electrodes 505 (505a or 505b) are alternately stacked. The multilayered structure has a configuration in which the piezoelectric material layers are sandwiched between the first electrode 501 and the second electrode 503, and includes an external electrode 506a and an external electrode 506b for short-circuiting the alternately formed internal electrodes.

The internal electrodes 55 and 505, the external electrodes 506a and 506b, the first electrodes 51 and 501, and the second electrodes 53 and 503 do not need to be identical in size and shape to the piezoelectric material layers 54 and 504, and may each be divided into a plurality of portions.

The internal electrodes 55 and 505, the external electrodes 506a and 506b, the first electrodes 51 and 501, and the second electrodes 53 and 503 are each formed of a conductive layer having a thickness of from about 5 nm to about 10 μm. A material for each of the electrodes is not particularly limited and only needs to be one to be generally used for a piezoelectric element. Examples thereof may include metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be formed of one kind of those metals and compounds, may be formed of a mixture or alloy of two or more kinds thereof, or may be formed of a multilayered body of two or more kinds thereof. In addition, a plurality of electrodes may be respectively formed of materials different from each other.

The internal electrodes 55 and 505 each contain Ag and Pd, and a weight ratio M1/M2 between the content weight M1 of the Ag and the content weight M2 of the Pd preferably falls within the range of $1.5 \leq M1/M2 \leq 9.0$. A case in which the weight ratio M1/M2 is less than 1.5 is not desired because the increase of the Pd component increases electrode cost, though the heat resistance of the internal electrode is high. Meanwhile, a case in which the weight ratio M1/M2 is more than 9.0 is not desired because, owing to the lack of the heat-resistant temperature of the internal electrode, the internal electrode is formed in an island shape, resulting in in-plane non-uniformity. From the viewpoints of heat resistance and cost, the weight ratio M1/M2 more preferably falls within the range of $2.0 \leq M1/M2 \leq 5.0$.

From the viewpoint that an electrode material is inexpensive, it is preferred that the internal electrodes 55 and 505 each contain at least any one kind selected from the group consisting of Ni and Cu. When at least any one kind selected from the group consisting of Ni and Cu is used for each of the internal electrodes 55 and 505, the multilayered piezoelectric element according to at least one embodiment of the present disclosure is preferably fired in a reducing atmosphere.

As illustrated in FIG. 2B, a plurality of electrodes including the internal electrodes 505 may be short-circuited to each other for the purpose of making the phases of their driving voltages uniform. For example, the internal electrode 505a and the first electrode 501 may be short-circuited through the external electrode 506a. The internal electrode 505b and the second electrode 503 may be short-circuited through the external electrode 506b. The internal electrode 505a and the internal electrode 505b may be alternately arranged. In addition, a mode in which the electrodes are short-circuited to each other is not limited. An electrode or wiring for short-circuiting may be arranged on a side surface of the multilayered piezoelectric element, or the electrodes may be short-circuited to each other by forming a through-hole passing through the piezoelectric material layers 504 and arranging a conductive material inside the through-hole.

(Manufacturing Method for Multilayered Piezoelectric Element)

Although a manufacturing method for the multilayered piezoelectric element according to at least one embodiment of the present disclosure is not particularly limited, a production method therefor is exemplified below. First, a step (A) of dispersing metal compound powder containing at least Mn, Na, Nb, Ba, Ti, and Bi to obtain a slurry, and a step (B) including placing the slurry on a base material and obtaining a compact are performed. After that, a step (C) of forming electrodes on the compact and a step (D) of sintering the compact having the electrodes formed thereon to obtain a multilayered piezoelectric element are performed.

Metal oxides to be used in the step (A) preferably include sodium niobate, barium titanate, and sodium bismuth titanate each having a perovskite-type structure. With this, a more satisfactory mechanical quality factor can be obtained.

(Electronic Equipment)

An electronic equipment according to at least one embodiment of the present disclosure includes the above-mentioned piezoelectric element according to at least one embodiment of the present disclosure.

Figure 3A:
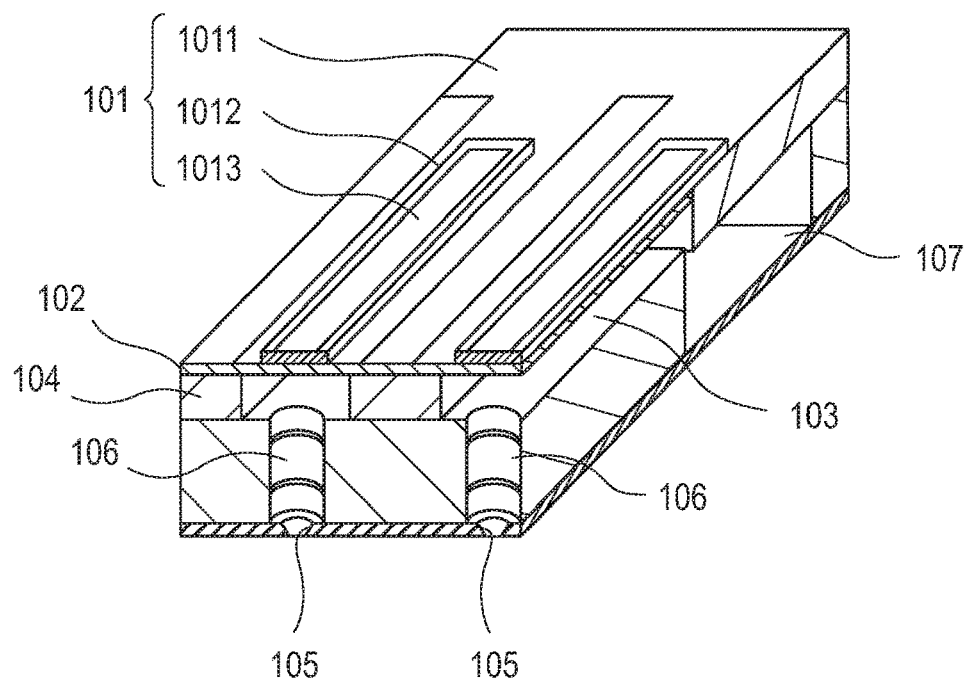
FIG. 3A is a schematic view for illustrating an electronic equipment according to at least one embodiment of the present disclosure.
Figure 3B:
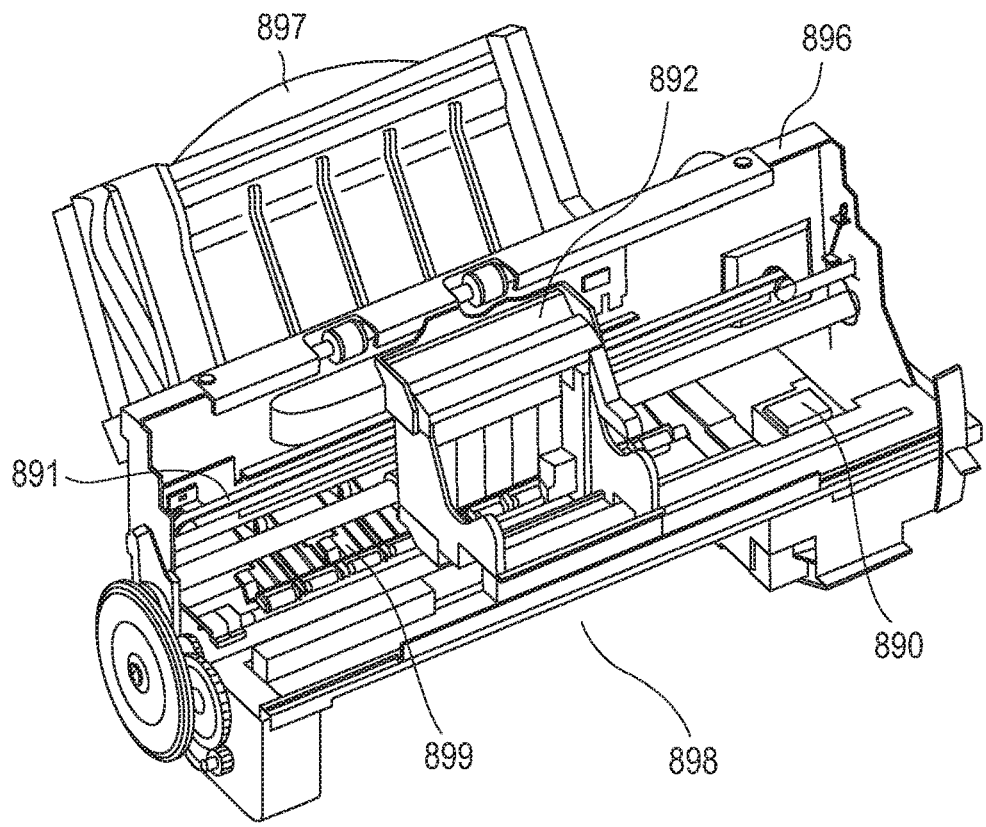
FIG. 3B is a schematic view for illustrating an electronic equipment according to at least one embodiment of the present disclosure.

Electronic Equipment Examples 1: Liquid Ejection Head and Liquid Ejection Apparatus FIG. 3A and FIG. 3B are schematic views for schematically illustrating the configurations of a liquid ejection head including the piezoelectric element according to at least one embodiment of the present disclosure and a liquid ejection apparatus using the liquid ejection head, as examples of the electronic equipment according to at least one embodiment of the present disclosure. The liquid ejection head includes at least a liquid chamber including a vibration unit including the piezoelectric element or the multilayered piezoelectric element, and an ejection port communicating to the liquid chamber. The liquid discharge device includes a stage configured to receive an object and the liquid ejection head. The shapes and arrangement of the members are not limited to the examples of FIG. 3A and FIG. 3B.

As illustrated in FIG. 3A, the liquid ejection head serving as the electronic equipment according to at least one embodiment of the present disclosure includes a piezoelectric element 101 according to at least one embodiment of the present disclosure. The piezoelectric element 101 includes at least a first electrode 1011, a piezoelectric material 1012, and a second electrode 1013. The piezoelectric material 1012 and the second electrode 1013 may be patterned for the purpose of increasing the ejection capacity of the liquid ejection head.

The liquid ejection head includes ejection ports 105, independent liquid chambers 103, communicating holes 106 for connecting the independent liquid chambers 103 and the ejection ports 105, liquid chamber partition walls 104, a common liquid chamber 107, a diaphragm 102, and the piezoelectric element 101. In general, the piezoelectric material 1012 has a shape in conformity with the shape of the independent liquid chamber 103.

When the liquid ejection head serving as an example of the electronic equipment according to at least one embodiment of the present disclosure is driven by inputting an electric signal thereinto, the diaphragm 102 vibrates up and down in accordance with the deformation of the piezoelectric element 101 to apply a pressure to a liquid stored in each of the independent liquid chambers 103. As a result, the liquid is ejected from each of the ejection ports 105. The liquid ejection head may be used for incorporation into a printer configured to perform printing on various media or manufacture of an electronic equipment.

Next, a liquid ejection apparatus using the liquid ejection head is described. In FIG. 3B, an ink jet recording apparatus serving as the liquid ejection apparatus is illustrated.

The liquid ejection apparatus of FIG. 3B includes various mechanisms incorporated into the inside of an exterior 896. An automatic sheet feeder unit 897 has a function of automatically feeding a recording sheet as a transfer material into a device main body. The recording sheet fed from the automatic sheet feeder unit 897 is guided to a predetermined recording position (no reference symbol) by a conveyance unit 899, and after a recording operation, is guided again by the conveyance unit 899 from the recording position to a delivery portion 898. The conveyance unit 899 serves as a stage configured to receive an object. The liquid ejection apparatus includes, in addition to the foregoing, a recording unit 891 configured to perform recording on the recording sheet conveyed to the recording position, and a recovery unit 890 configured to perform a recovery process on the recording unit 891. The recording unit 891 includes a carriage 892 in which the liquid ejection head is housed to be reciprocated on a rail.

In such liquid ejection apparatus, the carriage 892 carries the liquid ejection head in accordance with an instruction from an external computer, and ink is ejected from the ejection ports 105 of the liquid ejection head in response to a voltage applied to the piezoelectric element according to at least one embodiment of the present disclosure. Thus, printing is performed.

In the example described above, the ink jet recording apparatus is exemplified. However, the liquid ejection apparatus according to at least one embodiment of the present disclosure may be used as a printing apparatus, such as an ink jet recording apparatus, e.g., a facsimile, a multifunctional peripheral, or a copying machine, or as an industrial liquid ejection apparatus or a drawing apparatus for an object. In addition, a user may select a desired transfer material depending on applications.

Electronic Equipment Examples 2: Oscillatory Wave Motor and Optical Equipment

FIG. 4A to FIG. 4E are schematic views for schematically illustrating the configurations of an oscillatory wave motor including the piezoelectric element according to at least one embodiment of the present disclosure and an optical equipment using the oscillatory wave motor, as examples of the electronic equipment according to at least one embodiment of the present disclosure. The oscillatory wave motor includes at least a vibration body including the piezoelectric element or the multilayered piezoelectric element, and a moving body to be brought into contact with the vibration body. The optical equipment includes a drive unit including the oscillatory wave motor. The shapes and arrangement of the members are not limited to the examples of FIG. 4A to FIG. 4E.

Figure 4A:
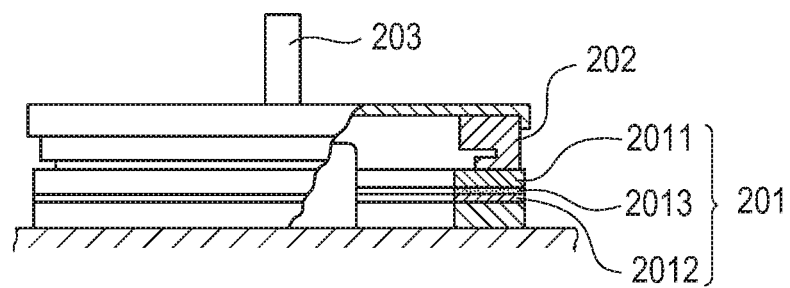
FIG. 4A is a schematic view for illustrating an electronic equipment according to at least one embodiment of the present disclosure.

FIG. 4A is an illustration of an oscillatory wave motor in which the piezoelectric element according to at least one embodiment of the present disclosure is formed of a single plate. The oscillatory wave motor includes a vibration body 201, a moving body 202 (also referred to as rotor), which is brought into contact with the sliding surface of the vibration body 201 with a pressure applied by a pressurizing spring (not shown), and an output shaft 203 arranged so as to be integrated with the moving body 202. The vibration body 201 is formed of a metal elastic ring 2011, a piezoelectric element 2012 according to at least one embodiment of the present disclosure, and an organic adhesive 2013 for bonding the piezoelectric element 2012 to the elastic ring 2011 (such as an epoxy-based adhesive or a cyanoacrylate-based adhesive).

The application of two alternating voltages different from each other in phase by an odd multiple of $\pi/2$ to the piezoelectric element results in the generation of a flexural traveling wave in the vibration body 201, and hence each point on the sliding surface of the vibration body 201 undergoes an elliptical motion. The rotor 202 receives a frictional force from the vibration body 201 to rotate in the direction opposite to the flexural traveling wave. A body to be driven (not shown) is joined to the output shaft 203, and is driven by the rotary force of the rotor 202.

Figure 4B:
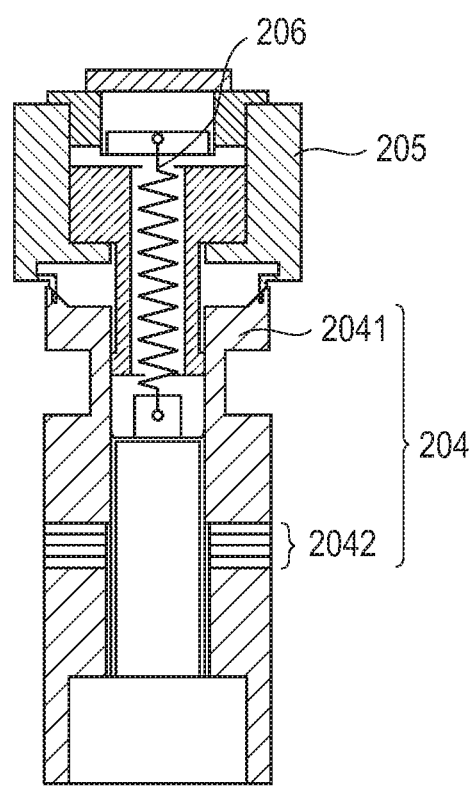
FIG. 4B is a schematic cross-sectional view for illustrating an electronic equipment according to at least one embodiment of the present disclosure.

Next, an oscillatory wave motor including a piezoelectric element having a multilayered structure (multilayered piezoelectric element) is illustrated in FIG. 4B. A vibration body 204 is formed of a multilayered piezoelectric element 2042 sandwiched between tubular metal elastic bodies 2041. The multilayered piezoelectric element 2042 is the multilayered piezoelectric element, and includes a first electrode and a second electrode on its outer surfaces of the stack, and internal electrodes on its inner surfaces of the stack. The metal elastic bodies 2041 sandwich and fix the multilayered piezoelectric element 2042 with bolts to form the vibration body 204.

The application of alternating voltages different from each other in phase to the multilayered piezoelectric element 2042 causes the vibration body 204 to excite two vibrations orthogonal to each other. The two vibrations are combined to form a circular vibration for driving the tip portion of the vibration body 204. A constricted annular groove is formed in the upper portion of the vibration body 204 to enlarge the displacement of the vibration for driving.

A moving body 205 (also referred to as rotor) is brought into contact with the vibration body 204 under pressure by a spring 206 for pressurization to obtain a frictional force for driving. The moving body 205 is rotatably supported by a bearing.

Figure 4C:
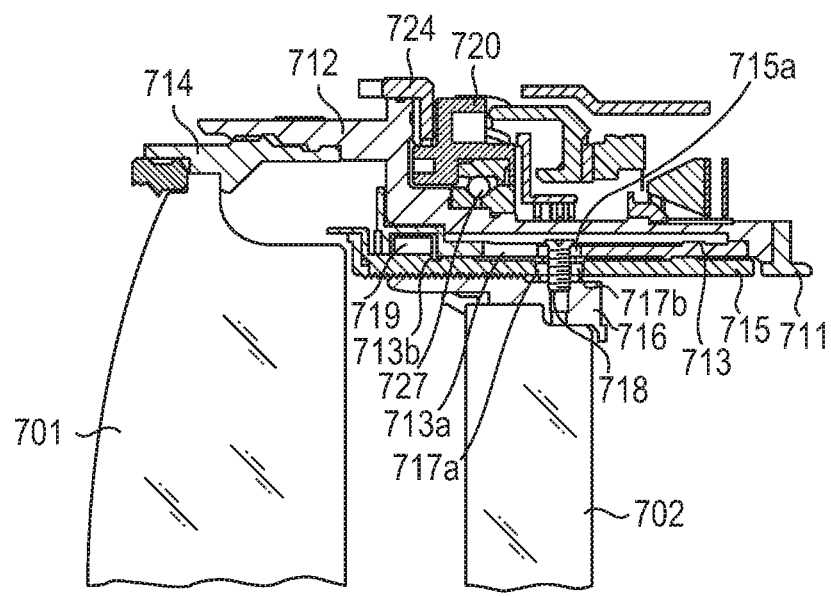
FIG. 4C is a schematic cross-sectional view for illustrating an electronic equipment according to at least one embodiment of the present disclosure.
Figure 4D:
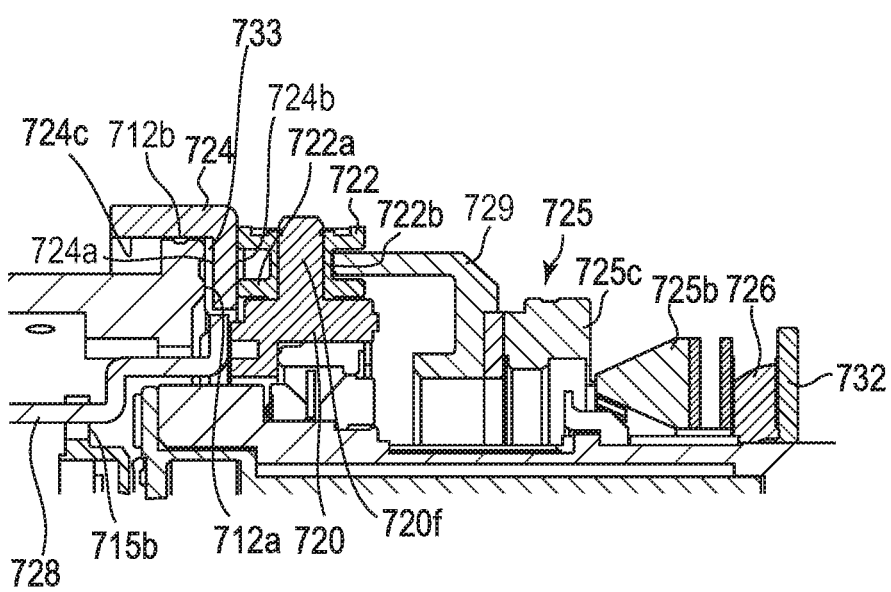
FIG. 4D is a schematic cross-sectional view for illustrating the electronic equipment according to at least one embodiment of the present disclosure.
Figure 4E:
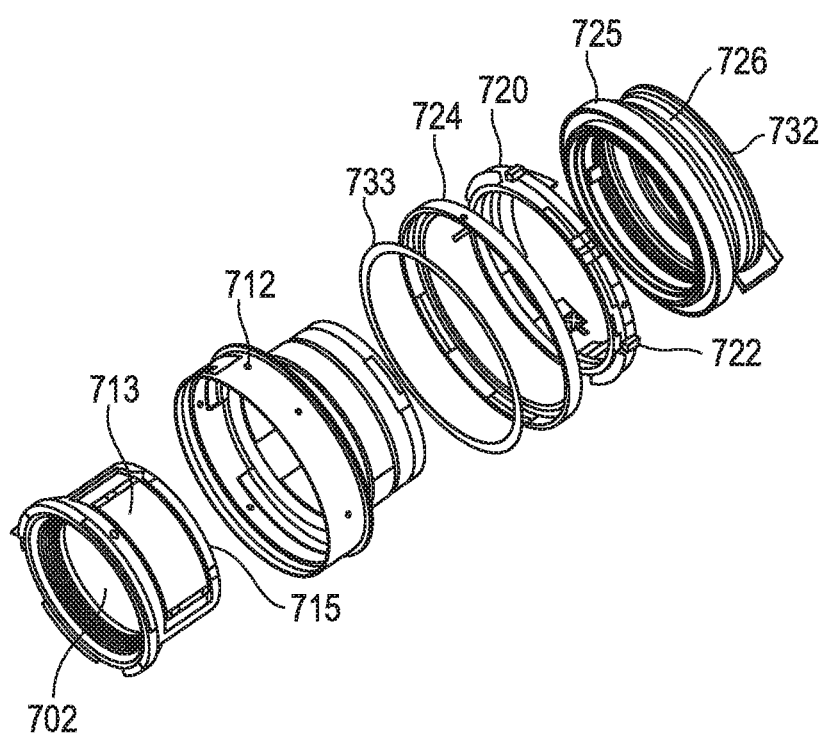
FIG. 4E is an exploded perspective view for illustrating the electronic equipment according to at least one embodiment of the present disclosure.

Next, an optical equipment using the oscillatory wave motor is described. In FIG. 4C, FIG. 4D, and FIG. 4E, an interchangeable lens barrel for a single-lens reflex camera serving as the optical equipment is illustrated.

A fixed barrel 712, a linear guide barrel 713, and a front unit barrel 714 are fixed to an attaching/detaching mount 711 for a camera. Those members are fixed members of the interchangeable lens barrel.

A linear guide groove 713a in an optical axis direction for a focus lens 702 is formed on the linear guide barrel 713. Cam rollers 717a and 717b protruding outward in a radial direction are fixed to a rear unit barrel 716 holding the focus lens 702 via axial screws 718, and the cam roller 717a is fitted in the linear guide groove 713a.

A cam ring 715 is fitted on the inner periphery of the linear guide barrel 713 in a rotatable manner. Relative movement between the linear guide barrel 713 and the cam ring 715 in the optical axis direction is restricted because a roller 719 fixed to the cam ring 715 is fitted in an annular groove 713b of the linear guide barrel 713. A cam groove 715a for the focus lens 702 is formed on the cam ring 715, and the above-mentioned cam roller 717b is simultaneously fitted in the cam groove 715a.

On the outer peripheral side of the fixed barrel 712, there is arranged a rotation transmission ring 720 held by a ball race 727 in a rotatable manner at a constant position with respect to the fixed barrel 712. The rotation transmission ring 720 has shafts 720f extending radially from the rotation transmission ring 720, and rollers 722 are held by the shafts 720f in a rotatable manner. A large diameter part 722a of the roller 722 is brought into contact with a mount side end surface 724b of a manual focus ring 724. In addition, a small diameter part 722b of the roller 722 is brought into contact with a joining member 729. Six rollers 722 are arranged on the outer periphery of the rotation transmission ring 720 at regular intervals, and each roller is arranged in the relationship as described above.

A low friction sheet (washer member) 733 is arranged on an inner diameter part of the manual focus ring 724, and this low friction sheet 733 is sandwiched between a mount side end surface 712a of the fixed barrel 712 and a front side end surface 724a of the manual focus ring 724. In addition, an outer diameter surface of the low friction sheet 733 is formed in a ring shape so as to be circumferentially fitted on an inner diameter part 724c of the manual focus ring 724. Further, the inner diameter part 724c of the manual focus ring 724 is circumferentially fitted on an outer diameter part 712b of the fixed barrel 712. The low friction sheet 733 has a role of reducing friction in a rotation ring mechanism in which the manual focus ring 724 rotates relatively to the fixed barrel 712 about the optical axis.

The large diameter part 722a of the roller 722 is brought into contact with the mount side end surface 724b of the manual focus ring under a state in which a pressure is applied by a pressing force of a waved washer 726 pressing an oscillatory wave motor 725 to the front of the lens. In addition, similarly, the small diameter part 722b of the roller 722 is brought into contact with the joining member 729 under a state in which an appropriate pressure is applied by a pressing force of the waved washer 726 pressing the oscillatory wave motor 725 to the front of the lens. Movement of the waved washer 726 in the mount direction is restricted by a washer 732 connected to the fixed barrel 712 by bayonet joint. A spring force (biasing force) generated by the waved washer 726 is transmitted to the oscillatory wave motor 725, and further to the roller 722, to be a force for the manual focus ring 724 to press the mount side end surface 712a of the fixed barrel 712. In other words, the manual focus ring 724 is integrated under a state in which the manual focus ring 724 is pressed to the mount side end surface 712a of the fixed barrel 712 via the low friction sheet 733.

Therefore, when a control unit (not shown) drives the oscillatory wave motor 725 to rotate with respect to the fixed barrel 712, the rollers 722 rotate about the shafts 720f because the joining member 729 is brought into frictional contact with the small diameter parts 722b of the rollers 722. As a result of the rotation of the rollers 722 about the shafts 720f, the rotation transmission ring 720 rotates about the optical axis (automatic focus operation).

In addition, when a manual operation input portion (not shown) gives a rotation force about the optical axis to the manual focus ring 724, the following action occurs.

That is, the rollers 722 rotate about the shafts 720f by friction force because the mount side end surface 724b of the manual focus ring 724 is brought into pressure contact with the large diameter parts 722a of the rollers 722. When the large diameter parts 722a of the rollers 722 rotate about the shafts 720f, the rotation transmission ring 720 rotates about the optical axis. In this case, the oscillatory wave motor 725 does not rotate because of a friction retaining force between a rotor 725c and a stator 725b (manual focus operation).

Two focus keys 728 are mounted to the rotation transmission ring 720 at opposing positions, and the focus key 728 is fitted to a notch portion 715b arranged on the tip of the cam ring 715. Therefore, when the rotation transmission ring 720 rotates about the optical axis, the rotation force is transmitted to the cam ring 715 via the focus key 728. When the cam ring 715 is rotated about the optical axis, the rear unit barrel 716 whose rotation is restricted by the cam roller 717a and the linear guide groove 713a is moved forward and backward along the cam groove 715a of the cam ring 715 by the cam roller 717b. Thus, the focus lens 702 is driven, and the focus operation is performed.

While the interchangeable lens barrel for the single-lens reflex camera has been described as the optical equipment using the oscillatory wave motor, the oscillatory wave motor can be applied to any optical equipment including the drive unit including the oscillatory wave motor, regardless of a type of the camera, including a compact camera, an electronic still camera, and the like.

Electronic Equipment Examples 3: Vibration Device and Image Pickup Apparatus

Figure 5A:
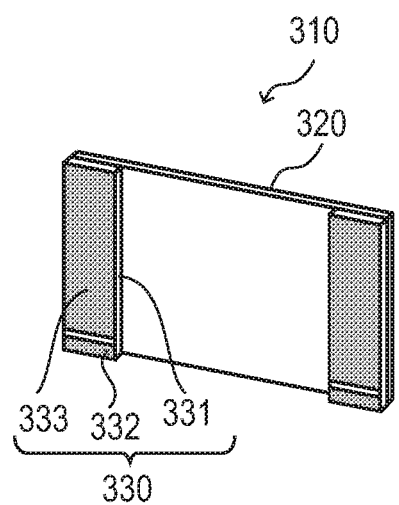
FIG. 5A is a schematic view for illustrating an electronic equipment according to at least one embodiment of the present disclosure.
Figure 5B:
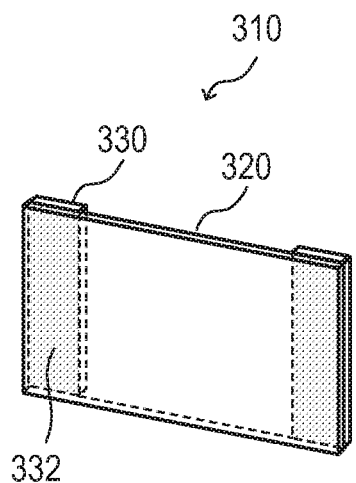
FIG. 5B is a schematic view for illustrating the electronic equipment according to at least one embodiment of the present disclosure.

FIG. 5A to FIG. 5D are schematic views for schematically illustrating the configurations of a vibration device including the piezoelectric element according to at least one embodiment of the present disclosure and an image pickup apparatus using the vibration device. The vibration device illustrated in FIG. 5A and FIG. 5B is a dust removing apparatus including at least a vibration body including a diaphragm including the piezoelectric element according to at least one embodiment of the present disclosure, the dust removing apparatus having a function of removing dust sticking to the surface of the diaphragm. The image pickup apparatus is an image pickup apparatus including at least the dust removing apparatus and an image pickup element unit, wherein the diaphragm of the dust removing apparatus is arranged on a light receiving surface of the image pickup element unit. The shapes and arrangement of the members are not limited to the examples of FIG. 5A to FIG. 5D.

FIG. 5A and FIG. 5B are schematic views for illustrating the dust removing apparatus serving as the electronic equipment according to at least one embodiment of the present disclosure. A dust removing apparatus 310 includes a plate-like piezoelectric element 330 and a diaphragm 320. The piezoelectric element 330 may be the multilayered piezoelectric element according to at least one embodiment of the present disclosure. A material for the diaphragm 320 is not limited. In the case where the dust removing apparatus 310 is used for an optical equipment, a light-transmissive material or a light-reflective material may be used as the diaphragm 320, and a light-transmissive portion or light-reflective portion of the diaphragm is subjected to dust removal.

The piezoelectric element 330 includes a piezoelectric material 331, a first electrode 332, and a second electrode 333, and the first electrode 332 and the second electrode 333 are arranged so as to be opposed to each other on the plate planes of the piezoelectric material 331. In the case of the multilayered piezoelectric element, the piezoelectric material 331 has an alternate structure of a piezoelectric material layer and an internal electrode, and can provide driving waveforms different from each other in phase depending on layers of the piezoelectric material by short-circuiting the internal electrode with the first electrode 332 or the second electrode 333 alternately. In FIG. 5A, the first electrode 332 extends around to the plate plane of the piezoelectric material 331 on which the second electrode 333 is arranged.

When an alternating voltage is externally applied to the piezoelectric element 330, a stress is generated between the piezoelectric element 330 and the diaphragm 320 to generate out-of-plane oscillation in the diaphragm 320. The dust removing apparatus 310 is a device configured to remove foreign matter, such as dust, sticking to the surface of the diaphragm 320 by the out-of-plane oscillation of the diaphragm 320. The out-of-plane oscillation refers to elastic vibration in which the diaphragm is displaced in an optical axis direction, namely in the thickness direction of the diaphragm.

Figure 5C:
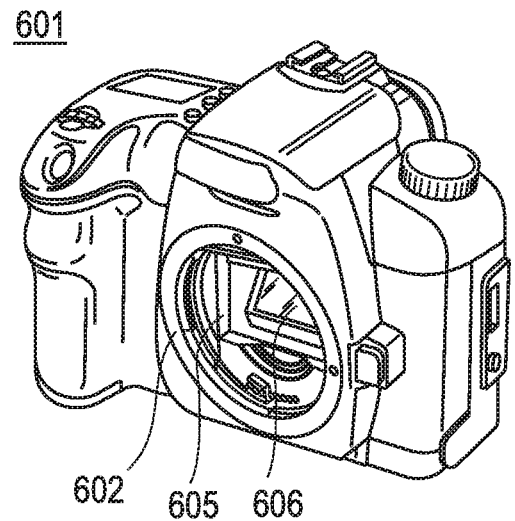
FIG. 5C is a schematic view for illustrating an electronic equipment according to at least one embodiment of the present disclosure.
Figure 5D:
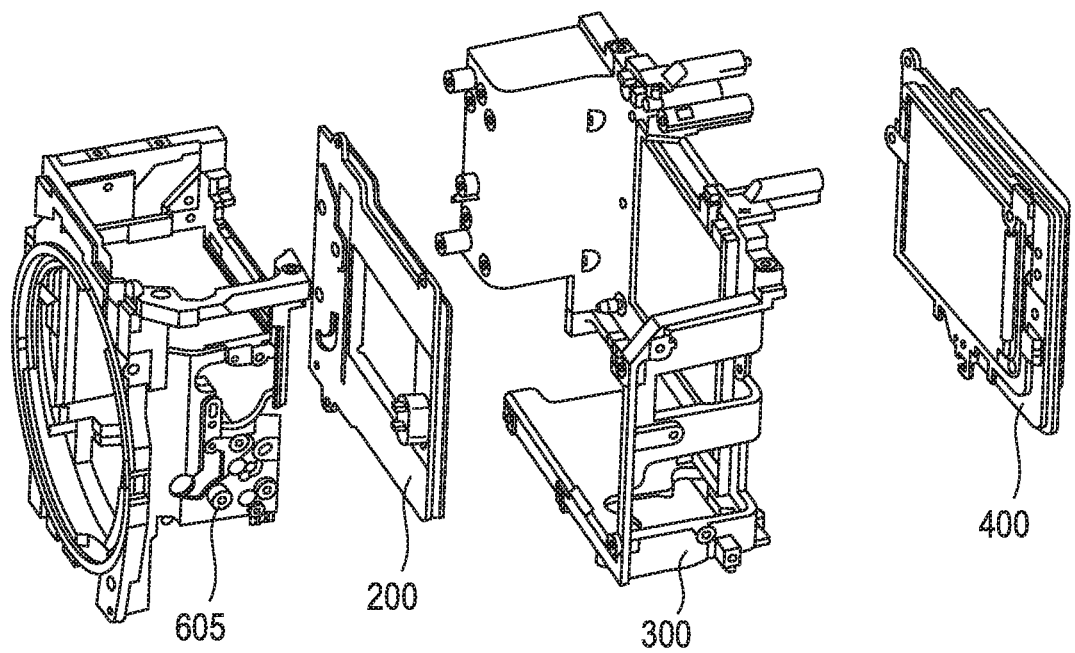
FIG. 5D is an exploded perspective view for illustrating the electronic equipment according to at least one embodiment of the present disclosure.

Next, the image pickup apparatus using the dust removing apparatus is described. In FIG. 5C and FIG. 5D, a digital single-lens reflex camera serving as the image pickup apparatus is illustrated.

FIG. 5C is a front side perspective view of a camera main body 601 viewed from an object side, for illustrating a state in which an imaging lens unit is removed. FIG. 5D is an exploded perspective view for illustrating an internal schematic configuration of the camera, for describing a peripheral structure of the dust removing apparatus and an image pickup unit 400. In the camera main body 601 illustrated in FIG. 5C, a mirror box 605 configured to guide an imaging light beam that has passed through an imaging lens is arranged, and a main mirror (quick return mirror) 606 is arranged in the mirror box 605. The main mirror 606 may take each of: a state of being held at an angle of 45° with respect to an imaging optical axis in order to guide the imaging light beam in the direction of a penta-Dach mirror (not shown); and a state of being held at a position retreated from the imaging light beam in order to guide the imaging light beam in the direction of an image pickup element (not shown).

In FIG. 5D, on the object side of a main body chassis 300 serving as a framework of the camera main body, the mirror box 605 and a shutter unit 200 are arranged in order from the object side. In addition, on the photographer side of the main body chassis 300, the image pickup unit 400 is arranged. The image pickup unit 400 includes the diaphragm of the dust removing apparatus and an image pickup element unit. In addition, the diaphragm of the dust removing apparatus and the light receiving plane of the image pickup element unit are sequentially arranged on the same axis. The image pickup unit 400 is arranged on the mounting surface of a mount portion 602 (FIG. 5C) serving as a reference for mounting the imaging lens unit, and is adjusted so that the image pickup surface of the image pickup element unit may be parallel to an image pickup lens unit at a predetermined distance.

Herein, the digital single-lens reflex camera has been described as an example of the image pickup apparatus, but the image pickup apparatus may be a camera with an interchangeable imaging lens unit, such as a mirrorless digital single-lens camera without the mirror box 605. In addition, the present disclosure may also be applied to various types of image pickup apparatus or electronic and electric devices including the image pickup apparatus, such as a video camera with an interchangeable imaging lens unit, a copying machine, a facsimile, and a scanner, in particular, a device that is required to remove dust sticking to the surface of an optical component.

The liquid ejection head, the liquid ejection apparatus, the oscillatory wave motor, the optical equipment, the vibration device, the dust removing apparatus, and the image pickup apparatus have been described above as examples of the electronic equipment according to at least one embodiment of the present disclosure, but the kind of the electronic equipment is not limited thereto. The piezoelectric element according to at least one embodiment of the present disclosure is applicable to all of the following: electronic equipments each configured to detect an electric signal resulting from a positive piezoelectric effect or extract energy by extracting electric power from a piezoelectric element; and electronic equipments each utilizing a displacement based on a converse piezoelectric effect obtained by inputting electric power into a piezoelectric element. For example, a piezoelectric acoustic component and a sound reproduction device, a sound recording device, a cellular phone, and an information terminal each including the piezoelectric acoustic component are also encompassed in the electronic equipment according to at least one embodiment of the present disclosure.

EXAMPLES

The piezoelectric material, piezoelectric element, and electronic equipment according to at least one embodiment of the present disclosure are hereinafter described more specifically by way of Examples. However, the present disclosure is not limited to the following Examples.

Piezoelectric materials according to Examples and Comparative Examples were produced, processed, and evaluated by such procedures as described below. In the manufacture of a ceramics-like piezoelectric material, the density of the piezoelectric material was evaluated by the Archimedes method, and when its relative density was 93% or more of its theoretical density, it was judged that crystallization had sufficiently proceeded. A crystal structure was identified by performing X-ray diffraction measurement and Rietveld analysis. The theoretical density was calculated from the identified crystal structure.

Example 1

For raw materials, powders of sodium niobate ($NaNbO_3$, purity: 99.5% or more), barium titanate ($BaTiO_3$, purity: 99.8% or more), sodium bismuth titanate, and manganese oxide ($Mn_3O_4$, purity: 99.9%, a molar amount was calculated as $MnO_{4/3}$) were used.

The above-mentioned sodium bismuth titanate powder was produced by weighing and mixing $Bi_2O_3$ powder, $NaCO_3$ powder, and $TiO_2$ powder so that the ratio of Bi:Na:Ti was w:s:(w+s)=0.04167:0.04167:0.08334=1:1:2, and calcining the mixture in air at 900° C. for 2 hours, followed by pulverization. The resultant powder was substantially formed of a single phase of a perovskite-type structure.

The raw materials were weighed and mixed at the following ratio as a feed composition: $Na_{x+s(1-y)}(Bi_w Ba_{1-s-w})_{1-y}Nb_yTi_{1-y}O_3$ (x=0.880, y=0.880, w=0.04167, s=0.04167). Manganese oxide was added to the mixed powder so as to achieve a Mn amount of 0.10 mol % with respect to the total of the Nb and the Ti, and the materials were further mixed. A PVA binder was added, and the whole was granulated. The granulated powder was filled into a mold and compressed to produce a disc-like compact. The resultant compact was fired in air at a maximum temperature of 1,240° C. for 1 hour to provide a ceramics-like sintered body.

Figure 6A:
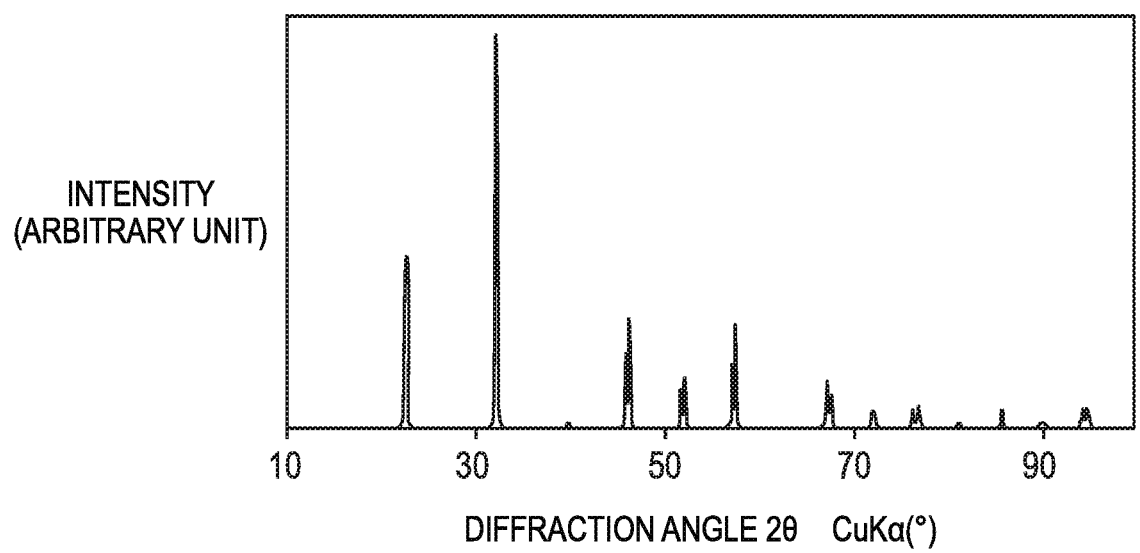
FIG. 6A is a graph for showing an X-ray diffraction pattern of a piezoelectric material of Example of the present disclosure.
Figure 6B:
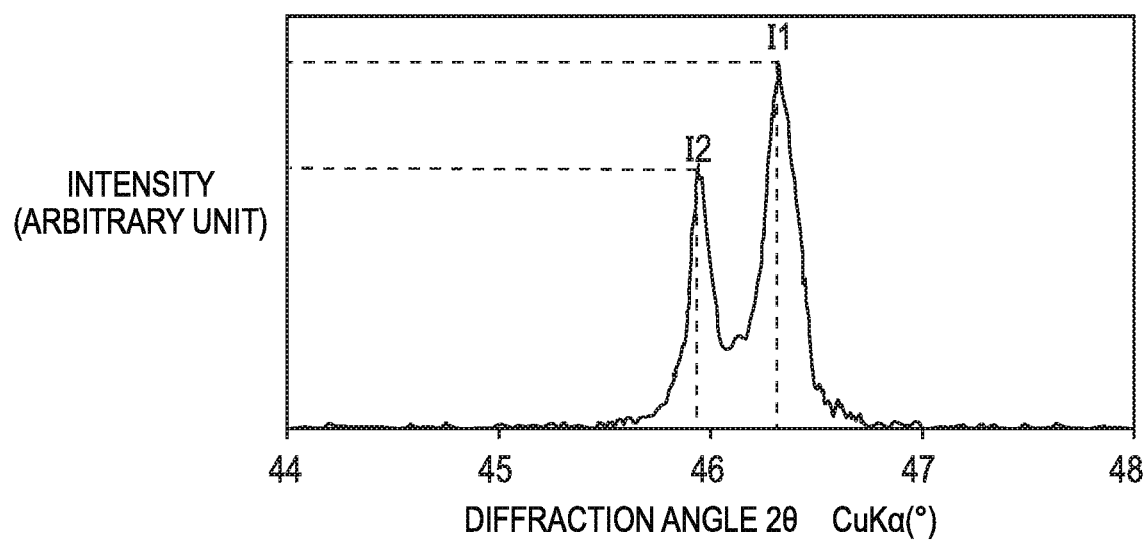
FIG. 6B is a partially enlarged graph for showing the X-ray diffraction pattern of the piezoelectric material of Example of the present disclosure.

The sintered body of the piezoelectric material was powdered and subjected to X-ray diffraction measurement of 2θ-θ with Cu—Kα rays at room temperature. In FIG. 6A and FIG. 6B, an X-ray diffraction pattern of the piezoelectric material of Example 1 is shown. In FIG. 6A, a pattern in the 2θ range of from 10° to 100° is shown, and in FIG. 6B, a pattern in the 2θ range of from 44° to 48° is shown. The crystal structure was identified from the resultant pattern by Rietveld analysis. As a result, it was able to be confirmed that the sample was substantially formed of a single phase of a perovskite structure, and it was found that the perovskite structure had a unit cell having a structure containing two oxygen octahedra. In addition, it was found that the perovskite structure had a P4bm structure. In the 2θ range of from 44° to 48°, two peaks were mainly able to be confirmed, and the largest peak was located on a high-angle side. The ratio I1/I2 of the largest peak intensity I1 to the next largest peak intensity I2 was 1.2.

The composition of the sintered body was evaluated by inductively coupled plasma optical emission spectrometry (ICP), and as a result, it was found that each of the Na, Ba, Nb, Ti, Mn, and Bi elements was contained in the sintered body at substantially the same ratio as in the intended composition. Components (excluding O) other than Na, Ba, Nb, Ti, Mn, and Bi accounted for less than 0.2 mol %. The content of each of Pb, K, Mg, and Cu in the sintered body was 1,000 ppm or less.

The surface of the sintered body was observed with an optical microscope and its grain diameter was evaluated. As a result, the average grain diameter of this Example was found to be 3.2 μm. For the observation of a crystal grain, a polarization microscope was mainly used. For the identification of the grain diameter of a small crystal grain, a scanning electron microscope (SEM) was used. An average equivalent circular diameter was calculated from the result of the observation, and defined as the average grain diameter. The density of the sintered body was 98% of the theoretical density.

The disc-like sintered body was polished to a thickness of 0.5 mm, and gold electrodes each having a thickness of 400 nm were formed on both front and rear surfaces thereof by a DC sputtering method. Titanium was formed into a film having a thickness of 30 nm as a contact layer between the electrodes and the ceramics. The ceramics with the electrodes was cut to provide three strip-shaped piezoelectric elements each having a size of 10 mm×2.5 mm×0.5 mm.

The piezoelectric elements were each subjected to polarization treatment by immersing the piezoelectric element in a silicone oil at 150° C. and applying an electric field of 2.4 kV/mm between the two electrodes of the piezoelectric element for 30 minutes.

The resistivity of the piezoelectric elements was measured, and the insulation property thereof was evaluated. A DC bias of 10 V was applied between the two electrodes of each of the piezoelectric elements, and the resistivity was evaluated from a leaked current value after 20 seconds. The result was as follows: the resistivity of the piezoelectric elements of Example 1 at room temperature was 1,607 GΩ·cm.

The piezoelectric elements of this Example had the following room-temperature properties: an absolute value $|d_{31}|$ of the piezoelectric constant $d_{31}$ of 53.5 pm/V, a mechanical quality factor $Q_m$ of 437, and a dielectric loss tangent tan δ at 1 kHz of 0.58%. The above-mentioned values of $|d_{31}|$, $Q_m$, and tan δ are average values for measurement of the three piezoelectric elements obtained from the same sintered body. In addition, the Curie temperature Tc was 210° C. The $d_{31}$, $Q_m$, and dielectric loss tangent of the piezoelectric elements were evaluated by the resonance-antiresonance method. With regard to the Curie temperature, a temperature at which a relative dielectric constant became maximum was measured, and the temperature was defined as the Curie temperature.

Examples 2 to 24

Piezoelectric materials and piezoelectric elements of Example 2 to Example 24 were produced through similar steps to those of Example 1.

The sodium bismuth titanate powder was produced by weighing and mixing $Bi_2O_3$ powder, $NaCO_3$ powder, and $TiO_2$ powder so that the ratio of Bi:Na:Ti was w:s:(w+s), and calcining the mixture in air at 900° C. for 2 hours, followed by pulverization. The values of "w" and "s" are shown in Table 1. The resultant powder was substantially formed of a single phase of a perovskite-type structure.

The above-mentioned powders of sodium bismuth titanate, sodium niobate ($NaNbO_3$, purity: 99.5% or more), barium titanate ($BaTiO_3$, purity: 99.8% or more), and manganese oxide ($Mn_3O_4$, purity: 99.9%) were weighed and mixed so that the feed composition had a ratio as shown in Table 1. The remaining manufacturing steps were performed under the same conditions as in Example 1. Thus, the piezoelectric materials and piezoelectric elements of Example 2 to Example 24 were produced.

The sintered body of the piezoelectric material of each Example was powdered and subjected to X-ray diffraction measurement of 2θ-θ with Cu—Kα rays at room temperature in the same manner as in Example 1. In all of Example 2 to Example 24, it was able to be confirmed that the sample was substantially formed of a single phase of a perovskite structure, and it was found that the perovskite structure had a unit cell having a structure containing two oxygen octahedra. In addition, the perovskite structure had a P4bm structure. In the 2θ range of from 44° to 48°, two peaks were mainly able to be confirmed, and the largest peak was located on a high-angle side. The ratio I1/I2 of the largest peak intensity I1 to the next largest peak intensity I2 had values shown in Table 1.

The composition of the sintered body of each Example was evaluated by ICP in the same manner as in Example 1, and as a result, it was found that each of the Na, Ba, Nb, Ti, Mn, and Bi elements was contained in the sintered body at substantially the same ratio as in the intended composition. Components (excluding O) other than Na, Ba, Nb, Ti, Mn, and Bi accounted for less than 0.2 mol %. The content of each of Pb, K, Mg, and Cu in the sintered body was 1,000 ppm or less.

The grain diameter on the surface of the sintered body was evaluated in the same manner as in Example 1, and as a result, the average grain diameter of each Example was found to fall within the range of 0.3 µm or more and 20 µm or less. In addition, the density of the sintered body of each Example was 95% or more of the theoretical density. In the same manner as in Example 1, the piezoelectric elements of each Example were subjected to polarization treatment, and the room-temperature properties and Curie temperature of the piezoelectric elements of each Example were evaluated. The absolute value $|d_{31}|$ of the piezoelectric constant $d_{31}$, the mechanical quality factor $Q_m$, the dielectric loss tangent at 1 kHz, the resistivity, and the Curie temperature Tc had values shown in Table 2.

Examples 25 to 28

Piezoelectric materials and piezoelectric elements of Example 25 to Example 28 were produced through similar steps to those of Example 1.

The powders of sodium bismuth titanate (Bi:Na:Ti=1:1:2, purity: 99.5% or more), sodium niobate (NaNbO$_3$, purity: 99.5% or more), barium titanate (BaTiO$_3$, purity: 99.8% or more), and manganese oxide (Mn$_3$O$_4$, purity: 99.9%) were weighed and mixed so that the feed composition had a ratio as shown in Table 1, to provide mixed powder.

In Example 25, powder of Pb was added to the mixed powder so that the Pb component had a mass ratio of 2,000 ppm, and the materials were further mixed.

In Example 26, powder of potassium hydrogen carbonate (KHCO$_3$) was added to the mixed powder so that the K component had a mass ratio of 2,000 ppm, and the materials were further mixed.

In Example 27, powder of magnesium oxide (MgO) was added to the mixed powder so that the Mg component had a mass ratio of 2,000 ppm, and the materials were further mixed.

In Example 28, powder of copper oxide (CuO) was added to the mixed powder so that the Cu component had a mass ratio of 2,000 ppm, and the materials were further mixed.

The remaining manufacturing steps were performed under the same conditions as in Example 1. Thus, the piezoelectric materials and piezoelectric elements of Example 25 to Example 28 were produced. The sintered body of the piezoelectric material of each Example was powdered and subjected to X-ray diffraction measurement of 2θ-θ with Cu—Kα rays at room temperature in the same manner as in Example 4. It was able to be confirmed that the sample of each of Example 25 to Example 27 was substantially formed of a single phase of a perovskite structure. In the sample of Example 28, about several percent of an impurity phase having a structure other than the perovskite structure was detected in addition to the perovskite structure. It was found that the perovskite structure of each Example 25 to Example 28 had a unit cell having a structure containing two oxygen octahedra. In addition, it was found that the perovskite structure had a P4bm structure. In the 2θ range of from 44° to 48°, two peaks were mainly able to be confirmed, and the largest peak was located on a high-angle side. The ratio I1/I2 of the largest peak intensity I1 to the next largest peak intensity I2 had values shown in Table 1.

In each of Examples, the composition of the sintered body was evaluated by ICP, and as a result, it was found that each of the Na, Ba, Nb, Ti, Mn, and Bi elements was contained in the sintered body at substantially the same ratio as in the intended composition. Components (excluding O) other than Na, Ba, Nb, Ti, Mn, and Bi accounted for less than 0.3 mol %.

The content of Pb in the sintered body of Example 25 was 2,000 ppm, and the content of each of K, Mg, and Cu therein was 1,000 ppm or less.

The content of K in the sintered body of Example 26 was 1,900 ppm, and the content of each of Pb, Mg, and Cu therein was 1,000 ppm or less.

The content of Mg in the sintered body of Example 27 was 2,000 ppm, and the content of each of Pb, K, and Cu therein was 1,000 ppm or less.

The content of Cu in the sintered body of Example 28 was 2,000 ppm, and the content of each of Pb, K, and Mg therein was 1,000 ppm or less.

The grain diameter on the surface of the sintered body was evaluated in the same manner as in Example 4, and as a result, the average grain diameter of each Example was found to fall within the range of 0.3 µm or more and 20 µm or less. In addition, the density of the sintered body of each Example was 95% or more of the theoretical density. In the same manner as in Example 4, the piezoelectric elements of each Example were subjected to polarization treatment, and the room-temperature properties and Curie temperature thereof were evaluated. The absolute value $|d_{31}|$ of the piezoelectric constant $d_{31}$, the mechanical quality factor $Q_m$, the dielectric loss tangent at 1 kHz, the resistivity, and the Curie temperature Tc had values shown in Table 2.

Examples 29 and 30

For raw materials, powders of niobium oxide (Nb$_2$O$_5$, purity: 99.5% or more), sodium carbonate (NaCO$_3$, purity: 99.5% or more), titanium oxide (TiO$_2$, purity: 99.8% or more), barium carbonate (BaCO$_3$, purity: 99.8% or more), bismuth oxide (Bi$_2$O$_3$, purity: 99.5% or more), and manganese oxide (Mn$_3$O$_4$, purity: 99.9%) were used. The raw materials were weighed and mixed so that the feed composition had a ratio as shown in Table 1. A PVA binder was added, and the whole was granulated.

The remaining manufacturing steps were performed under the same conditions as in Example 1. Thus, piezoelectric materials and piezoelectric elements of Example 29 and Example 30 were produced.

The sintered body of the piezoelectric material of each Example was powdered and subjected to X-ray diffraction measurement of 2θ-θ with Cu—Kα rays at room temperature in the same manner as in Example 1. In the sample of each of Example 29 and Example 30, about several percent of an impurity phase having a structure other than the perovskite structure was detected in addition to the perovskite structure. It was found that the perovskite structure of each of Example 29 and Example 30 had a unit cell having a structure containing two oxygen octahedra. In addition, it was found that the perovskite structure had a P4bm structure. In the 2θ range of from 44° to 48°, two peaks were mainly able to be confirmed, and the largest peak was located on a high-angle side. The ratio I1/I2 of the largest peak intensity I1 to the next largest peak intensity I2 had values shown in Table 1.

In each of Examples, the composition of the sintered body was evaluated by ICP, and as a result, it was found that each of the Na, Ba, Nb, Ti, Mn, and Bi elements was contained in the sintered body at substantially the same ratio as in the intended composition. Components (excluding O) other than Na, Ba, Nb, Ti, Mn, and Bi accounted for less than 0.2 mol %. The content of each of Pb, K, Mg, and Cu in the sintered body was 1,000 ppm or less.

The grain diameter on the surface of the sintered body was evaluated in the same manner as in Example 1, and as a result, the average grain diameter of each Example was found to fall within the range of 0.3 μm or more and 20 μm or less. In addition, the density of the sintered body of each Example was 95% or more of the theoretical density. In the same manner as in Example 1, the piezoelectric elements of each Example were subjected to polarization treatment, and the room-temperature properties and Curie temperature thereof were evaluated. The absolute value $|d_{31}|$ of the piezoelectric constant $d_{31}$, the mechanical quality factor $Q_m$, the dielectric loss tangent at 1 kHz, the resistivity, and the Curie temperature Tc had values shown in Table 2.

Examples 31 and 32

Piezoelectric materials and piezoelectric elements of Example 31 and Example 32 were produced through similar steps to those of Example 1.

Powders of sodium bismuth titanate (Bi:Na:Ti=1:1:2), sodium niobate (NaNbO$_3$, purity: 99.5% or more), barium titanate (BaTiO$_3$, purity: 99.8% or more), and manganese oxide (Mn$_3$O$_4$, purity: 99.9%) were weighed and mixed so that the feed composition had a ratio as shown in Table 1. A PVA binder was added to the mixed powder, and the whole was granulated. The granulated powder was filled into a mold and compressed to produce a disc-like compact.

In Example 31, the resultant compact was fired in air at a maximum temperature of 1,050° C. for 1 hour to provide a sintered body.

In Example 32, the resultant compact was fired in air at a maximum temperature of 1,350° C. for 1 hour to provide a sintered body.

The sintered body of the piezoelectric material was powdered and subjected to X-ray diffraction measurement of 2θ-θ with Cu—Kα rays at room temperature in the same manner as in Example 1. It was able to be confirmed that the sample of each Example 31 and Example 32 was substantially formed of a single phase of a perovskite structure. It was found that the perovskite structure of each of Example 31 and Example 32 had a unit cell having a structure containing two oxygen octahedra. In addition, it was assumed that the perovskite structure had a P4bm structure. In the 2θ range of from 44° to 48°, two peaks were mainly able to be confirmed, and the largest peak was located on a high-angle side. The ratio I1/I2 of the largest peak intensity I1 to the next largest peak intensity I2 had values shown in Table 1.

In each of Examples, the composition of the sintered body was evaluated by ICP, and as a result, it was found that each of the Na, Ba, Nb, Ti, Mn, and Bi elements was contained in the sintered body at substantially the same ratio as in the intended composition. Components (excluding O) other than Na, Ba, Nb, Ti, Mn, and Bi accounted for less than 0.2 mol %. The content of each of Pb, K, Mg, and Cu in the sintered body was 1,000 ppm or less.

The grain diameter on the surface of each of the sintered bodies was evaluated in the same manner as in Example 1, and as a result, the average grain diameter of Example 31 was found to be 0.22 μm and the average grain diameter of Example 32 was found to be 25 μm. In addition, the density of the sintered body of Example 31 was 93% or more and less than 95% of the theoretical density, and the density of the sintered body of Example 32 was 95% or more of the theoretical density. In the same manner as in Example 1, the piezoelectric elements of each Example were subjected to polarization treatment, and the room-temperature properties and Curie temperature of the piezoelectric elements of each Example were evaluated. The absolute value $|d_{31}|$ of the piezoelectric constant $d_{31}$, the mechanical quality factor $Q_m$, the dielectric loss tangent at 1 kHz, the resistivity, and the Curie temperature Tc had values shown in Table 2.

Comparative Examples 1 to 8

Piezoelectric materials for comparison and piezoelectric elements for comparison of Comparative Example 1 to Comparative Example 8 were produced through similar steps to those of Example 1.

The sodium bismuth titanate powder was produced by weighing and mixing Bi$_2$O$_3$ powder, NaCO$_3$ powder, and TiO$_2$ powder so that the ratio of Bi:Na:Ti was w:s:(w+s), and calcining the mixture in air at 900° C. for 2 hours, followed by pulverization. The values of "w" and "s" are shown in Table 1. The resultant powder was substantially formed of a single phase of a perovskite-type structure.

The above-mentioned powders of sodium bismuth titanate, sodium niobate (NaNbO$_3$, purity: 99.5% or more), barium titanate (BaTiO$_3$, purity: 99.8% or more), and manganese oxide (Mn$_3$O$_4$, purity: 99.9%) were weighed and mixed so that the feed composition had a ratio as shown in Table 1. The remaining manufacturing steps were performed under the same conditions as in Example 1. Thus, the piezoelectric materials for comparison and piezoelectric elements for comparison of Comparative Example 1 to Comparative Example 8 were produced.

The sintered body of the piezoelectric material for comparison was powdered and subjected to X-ray diffraction measurement of 2θ-θ with Cu—Kα rays at room temperature in the same manner as in Example 1. The sample of each of Comparative Example 1 to Comparative Example 7 was substantially formed of a single phase of a perovskite structure. In the sample of Comparative Example 8, about 10% of an impurity phase having a structure other than the perovskite structure was detected in addition to the perovskite structure. In the 2θ range of from 44° to 48°, two to three peaks were confirmed. The sample of each of Comparative Example 1 and Comparative Example 2 had the largest peak on a low-angle side. The sample of each of Comparative Example 3 to Comparative Example 8 had the largest peak on a high-angle side. In Comparative Example 3 to Comparative Example 8, the ratio I1/I2 of the largest peak intensity I1 to the next largest peak intensity I2 had values shown in Table 1.

In each of Comparative Examples, the composition of the sintered body was evaluated by ICP, and as a result, it was found that each of the Na, Ba, Nb, Ti, Mn, and Bi elements was contained in the sintered body at substantially the same ratio as in the intended composition. Components (excluding O) other than Na, Ba, Nb, Ti, Mn, and Bi accounted for less than 0.2 mol %. The content of each of Pb, K, Mg, and Cu in the sintered body was 1,000 ppm or less.

The grain diameter on the surface of each of the sintered bodies was evaluated in the same manner as in Example 1. As a result, the average grain diameter of each of Comparative Example 1 and Comparative Example 3 to Comparative Example 8 was found to fall within the range of 0.3 μm or more and 20 μm or less. The average grain diameter of Comparative Example 2 was found to be 0.18 μm. In addition, the density of each of the sintered bodies of Comparative Example 1, Comparative Example 3, Comparative Example 4, and Comparative Example 8 was 95% or more of the theoretical density. The density of each of the sintered bodies of Comparative Example 5 to Comparative Example 7 was 93% or more and less than 95% of the theoretical density. The density of the sintered body of Comparative Example 2 was less than 93% of the theoretical density. In the same manner as in Example 1, the piezoelectric elements for comparison of each Comparative Example were subjected to polarization treatment, and the room-temperature properties and Curie temperature of the piezoelectric elements were evaluated. The absolute value $|d_{31}|$ of the piezoelectric constant $d_{31}$, the mechanical quality factor $Q_m$, the dielectric loss tangent at 1 kHz, the resistivity, and the Curie temperature Tc had values shown in Table 2.

Comparative Example 9

For raw materials, powders of sodium niobate ($NaNbO_3$, purity: 99.5% or more), barium titanate ($BaTiO_3$, purity: 99.8% or more), potassium bismuth titanate ($Bi_{0.5}K_{0.5}TiO_3$, purity: 99.5% or more), and manganese oxide ($Mn_3O_4$, purity: 99.9%) were used.

The raw materials were weighed and mixed so as to achieve a feed composition of $Na_{0.88}(K_{0.4}Bi_{0.4}Ba_{0.6})_{0.12}Nb_{0.88}Ti_{0.12}O_3$. The remaining manufacturing steps were performed under the same conditions as in Example 1. Thus, a piezoelectric material for comparison and piezoelectric elements for comparison of Comparative Example 9 were produced.

The sintered body of the piezoelectric material for comparison was powdered and subjected to X-ray diffraction measurement of 2θ-θ with Cu—Kα rays at room temperature. In the 2θ range of from 44° to 48°, two peaks were able to be confirmed. The largest peak was located on a low-angle side, and the intensity ratio of the two peaks was substantially 1:2. It was confirmed that the sample was formed of a single phase of a tetragonal perovskite structure containing only one oxygen octahedron in its unit cell.

The grain diameter on the surface of the sintered body was evaluated in the same manner as in Example 1, and as a result, the average grain diameter of the piezoelectric material for comparison was found to fall within the range of 0.3 μm or more and 20 μm or less. In addition, the density of the sintered body was 95% or more of the theoretical density. In the same manner as in Example 1, the piezoelectric elements for comparison of Comparative Example 9 were subjected to polarization treatment, and the room-temperature properties and Curie temperature thereof were evaluated. The piezoelectric elements for comparison of Comparative Example 9 had the following room-temperature properties: an absolute value $|d_{31}|$ of the piezoelectric constant $d_{31}$ of 24.6 pm/V, a mechanical quality factor $Q_m$ of 199, a dielectric loss tangent at 1 kHz of 1.65%, and a resistivity of 9 GΩ·cm. In addition, the Curie temperature Tc was 165° C.

TABLE 1

|  | x | y | w | s | (w + s)(1 − y) | w/s | Content of Mn [mol %] | I1/I2 |
|---|---|---|---|---|---|---|---|---|
| Example 1 | 0.880 | 0.880 | 0.04167 | 0.04167 | 0.010 | 1.000 | 0.100 | 1.20 |
| Example 2 | 0.880 | 0.880 | 0.00833 | 0.00833 | 0.002 | 1.000 | 0.100 | 1.13 |
| Example 3 | 0.880 | 0.880 | 0.02083 | 0.02083 | 0.005 | 1.000 | 0.100 | 1.15 |
| Example 4 | 0.880 | 0.880 | 0.08333 | 0.08333 | 0.020 | 1.000 | 0.100 | 1.21 |
| Example 5 | 0.880 | 0.880 | 0.14583 | 0.14583 | 0.035 | 1.000 | 0.100 | 1.24 |
| Example 6 | 0.895 | 0.895 | 0.02381 | 0.02381 | 0.005 | 1.000 | 0.100 | 1.14 |
| Example 7 | 0.895 | 0.895 | 0.04762 | 0.04762 | 0.010 | 1.000 | 0.100 | 1.17 |
| Example 8 | 0.895 | 0.895 | 0.09524 | 0.09524 | 0.020 | 1.000 | 0.100 | 1.18 |
| Example 9 | 0.910 | 0.910 | 0.05556 | 0.05556 | 0.010 | 1.000 | 0.100 | 1.13 |
| Example 10 | 0.855 | 0.855 | 0.03448 | 0.03448 | 0.010 | 1.000 | 0.100 | 1.22 |
| Example 11 | 0.855 | 0.855 | 0.10345 | 0.10345 | 0.030 | 1.000 | 0.100 | 1.23 |
| Example 12 | 0.920 | 0.920 | 0.01250 | 0.01250 | 0.002 | 1.000 | 0.100 | 1.12 |
| Example 13 | 0.920 | 0.920 | 0.21875 | 0.21875 | 0.035 | 1.000 | 0.100 | 1.15 |
| Example 14 | 0.840 | 0.840 | 0.00625 | 0.00625 | 0.002 | 1.000 | 0.100 | 1.11 |
| Example 15 | 0.840 | 0.840 | 0.10938 | 0.10938 | 0.035 | 1.000 | 0.100 | 1.24 |
| Example 16 | 0.880 | 0.880 | 0.04167 | 0.04167 | 0.010 | 1.000 | 0.010 | 1.17 |
| Example 17 | 0.880 | 0.880 | 0.04167 | 0.04167 | 0.010 | 1.000 | 0.050 | 1.18 |
| Example 18 | 0.880 | 0.880 | 0.04167 | 0.04167 | 0.010 | 1.000 | 0.200 | 1.17 |
| Example 19 | 0.880 | 0.880 | 0.04167 | 0.04167 | 0.010 | 1.000 | 0.500 | 1.19 |
| Example 20 | 0.880 | 0.880 | 0.04167 | 0.04167 | 0.010 | 1.000 | 1.000 | 1.14 |
| Example 21 | 0.880 | 0.880 | 0.03947 | 0.04386 | 0.010 | 0.900 | 0.100 | 1.15 |
| Example 22 | 0.880 | 0.880 | 0.04060 | 0.04274 | 0.010 | 0.950 | 0.100 | 1.17 |
| Example 23 | 0.880 | 0.880 | 0.04268 | 0.04065 | 0.010 | 1.050 | 0.100 | 1.17 |
| Example 24 | 0.880 | 0.880 | 0.04365 | 0.03968 | 0.010 | 1.100 | 0.100 | 1.15 |
| Example 25 | 0.880 | 0.880 | 0.08333 | 0.08333 | 0.020 | 1.000 | 0.100 | 1.27 |
| Example 26 | 0.880 | 0.880 | 0.08333 | 0.08333 | 0.020 | 1.000 | 0.100 | 1.28 |
| Example 27 | 0.880 | 0.880 | 0.08333 | 0.08333 | 0.020 | 1.000 | 0.100 | 1.15 |
| Example 28 | 0.880 | 0.880 | 0.08333 | 0.08333 | 0.020 | 1.000 | 0.100 | 1.10 |
| Example 29 | 0.895 | 0.895 | 0.04762 | 0.04762 | 0.010 | 1.000 | 0.100 | 1.11 |
| Example 30 | 0.880 | 0.880 | 0.14583 | 0.14583 | 0.035 | 1.000 | 0.100 | 1.08 |
| Example 31 | 0.910 | 0.910 | 0.05556 | 0.05556 | 0.010 | 1.000 | 0.100 | 1.12 |
| Example 32 | 0.910 | 0.910 | 0.05556 | 0.05556 | 0.010 | 1.000 | 0.100 | 1.19 |
| Comparative Example 1 | 0.880 | 0.880 | 0.00000 | 0.00000 | 0.000 | 1.000 | 0.100 | — |
| Comparative Example 2 | 0.930 | 0.930 | 0.28571 | 0.28571 | 0.040 | 1.000 | 0.100 | — |

TABLE 1-continued

|  | x | y | w | s | (w + s)(1 − y) | w/s | Content of Mn [mol %] | I1/I2 |
|---|---|---|---|---|---|---|---|---|
| Comparative Example 3 | 0.880 | 0.880 | 0.16667 | 0.16667 | 0.040 | 1.000 | 0.100 | 1.32 |
| Comparative Example 4 | 0.830 | 0.830 | 0.11765 | 0.11765 | 0.040 | 1.000 | 0.100 | 1.31 |
| Comparative Example 5 | 0.880 | 0.880 | 0.12963 | 0.16204 | 0.035 | 0.800 | 0.100 | 1.11 |
| Comparative Example 6 | 0.880 | 0.880 | 0.15909 | 0.13258 | 0.035 | 1.200 | 0.100 | 1.09 |
| Comparative Example 7 | 0.920 | 0.920 | 0.21875 | 0.21875 | 0.035 | 1.000 | 0.005 | 1.12 |
| Comparative Example 8 | 0.920 | 0.920 | 0.21875 | 0.21875 | 0.035 | 1.000 | 1.200 | 1.20 |

TABLE 2

|  | $|d_{31}|$ [pm/V] | $Q_m$ | Tanδ [%] | Resistivity [GΩ · cm] | Tc [° C.] |
|---|---|---|---|---|---|
| Example 1 | 53.5 | 517 | 0.58 | 1,607 | 210 |
| Example 2 | 56.3 | 502 | 0.66 | 249 | 202 |
| Example 3 | 55.0 | 515 | 0.61 | 994 | 208 |
| Example 4 | 53.0 | 508 | 0.56 | 2,010 | 213 |
| Example 5 | 51.6 | 495 | 0.64 | 1,957 | 215 |
| Example 6 | 55.9 | 513 | 0.61 | 688 | 214 |
| Example 7 | 56.2 | 513 | 0.60 | 1,503 | 216 |
| Example 8 | 55.0 | 506 | 0.57 | 1,022 | 216 |
| Example 9 | 57.1 | 500 | 0.62 | 963 | 217 |
| Example 10 | 52.5 | 519 | 0.64 | 1,115 | 204 |
| Example 11 | 51.6 | 501 | 0.57 | 729 | 205 |
| Example 12 | 57.2 | 500 | 0.65 | 323 | 217 |
| Example 13 | 54.9 | 498 | 0.66 | 460 | 220 |
| Example 14 | 51.7 | 521 | 0.58 | 411 | 200 |
| Example 15 | 50.9 | 494 | 0.63 | 550 | 204 |
| Example 16 | 54.0 | 484 | 0.66 | 360 | 210 |
| Example 17 | 53.6 | 512 | 0.63 | 966 | 211 |
| Example 18 | 53.0 | 509 | 0.61 | 1,231 | 210 |
| Example 19 | 53.0 | 501 | 0.64 | 1,034 | 210 |
| Example 20 | 52.4 | 486 | 0.65 | 459 | 208 |
| Example 21 | 53.4 | 510 | 0.63 | 512 | 210 |
| Example 22 | 53.5 | 512 | 0.59 | 1,440 | 211 |
| Example 23 | 53.3 | 510 | 0.62 | 852 | 210 |
| Example 24 | 53.2 | 504 | 0.66 | 475 | 210 |
| Example 25 | 54.4 | 481 | 0.69 | 54 | 218 |
| Example 26 | 51.0 | 496 | 0.69 | 21 | 215 |
| Example 27 | 52.9 | 500 | 0.68 | 22 | 206 |
| Example 28 | 50.6 | 482 | 0.69 | 66 | 203 |
| Example 29 | 55.8 | 496 | 0.68 | 32 | 210 |
| Example 30 | 52.1 | 480 | 0.69 | 26 | 210 |
| Example 31 | 56.1 | 480 | 0.69 | 77 | 200 |
| Example 32 | 50.2 | 487 | 0.67 | 91 | 212 |
| Comparative Example 1 | 53.3 | 386 | 0.90 | 83 | 195 |
| Comparative Example 2 | 32.1 | 243 | 0.75 | 0.7 | 220 |
| Comparative Example 3 | 45.5 | 149 | 0.79 | 148 | 216 |
| Comparative Example 4 | 47.2 | 391 | 0.80 | 243 | 193 |
| Comparative Example 5 | 51.7 | 333 | 0.92 | 8 | 209 |
| Comparative Example 6 | 49.6 | 355 | 0.89 | 5 | 192 |
| Comparative Example 7 | 53.0 | 294 | 1.20 | 0.6 | 217 |
| Comparative Example 8 | 53.7 | 387 | 1.04 | 1 | 205 |

Discussion of Examples 1 to 32 and Comparative Examples 1 to 9

Next, the results of Examples and Comparative Examples are discussed using Table 2.

Example 1 to Example 32 substantially free of potassium each had a smaller variation in piezoelectric constant among the three piezoelectric elements obtained from one sintered body than Comparative Example 9 containing potassium. Of the three piezoelectric elements, the maximum value of $|d_{31}|$ is represented by $|d_{31}|_{max}$, the minimum value is represented by $|d_{31}|_{min}$, and the average value of the three piezoelectric constants is represented by $|d_{31}|_{ave}$. The variation in piezoelectric constant is represented by $v=(|d_{31}|_{max}-|d_{31}|_{min})/|d_{31}|_{ave}$. Comparative Example 9 had a "v" of 0.25, whereas Example 26 had a "v" of 0.18 and Example 1 to Example 25 and Example 27 to Example 32 each had a "v" as small as 0.1 or less.

In Comparative Example 1, in which the value of (w+s)(1−y) was less than 0.002, the largest peak in the range of from 44° to 48° in the X-ray diffraction measurement was located on a low-angle side, and hence the symmetry of the crystal was not sufficiently lowered. Therefore, as compared to Example 1 to Example 32, the mechanical quality factor is small and the dielectric loss tangent is large. As a result, consumed electric power at the time of the driving of an element was increased.

In Comparative Example 3, in which the value of (w+s)(1−y) was more than 0.035, the mechanical quality factor is small and the dielectric loss tangent is large, and hence efficiency at the time of the driving of an element is poor, as compared to Example 1 to Example 32.

In Comparative Example 2, in which "x" and "y" were larger than 0.92, the average grain diameter was 0.18 μm, indicating insufficient sintering, and the resistivity was low as compared to Example 1 to Example 32. As a result, polarization was insufficient, and hence the piezoelectric constant and the mechanical quality factor were small.

In Comparative Example 4, in which "x" and "y" were less than 0.84, the Curie temperature was less than 200° C., and the piezoelectric constant was small as compared to Example 1 to Example 32.

In each of Comparative Example 5 and Comparative Example 6, in which the value of w/s fell outside the range of 0.9≤w/s≤1.1, the resistivity was small, indicating an insufficient insulation property, and moreover, the dielectric loss tangent was large, as compared to Example 1 to Example 32.

In each of Comparative Example 7, in which the content of Mn was less than 0.01 mol %, and Comparative Example 8, in which the content of Mn was more than 1.00 mol %, the resistivity was small, indicating an insufficient insulation property, and moreover, the dielectric loss tangent was remarkably large, as compared to Example 1 to Example 32.

In Comparative Example 9, in which potassium bismuth titanate was used as a raw material, the symmetry of the crystal was not sufficiently lowered. As compared to Example 1 to Example 32, the piezoelectric constant, the mechanical quality factor, and the insulation property were small, and the dielectric loss tangent was remarkably large. In addition, the Tc was as low as less than 200° C.

Example 33

For raw materials, powders of sodium niobate ($NaNbO_3$, purity: 99.5% or more), barium titanate ($BaTiO_3$, purity: 99.8% or more), sodium bismuth titanate (Bi:Na:Ti=1:1:2), and manganese oxide ($Mn_3O_4$, purity: 99.9%) were used.

The raw materials were weighed and mixed at the following ratio as a feed composition: $Na_{x+s(1-y)}(Bi_w Ba_{1-s-w})_{1-y}Nb_yTi_{1-y}O_3$ (x=0.880, y=0.880, (w+s)(1−y)=0.010, w/s=1.000). Manganese oxide was added to the mixed powder so as to achieve a Mn amount of 0.10 mol % with respect to the total of the Nb and the Ti, and the materials were further mixed to provide mixed powder. PVB was added to the mixed powder, the materials were mixed, and then the mixture was formed into a sheet by a doctor blade method to provide a green sheet having a thickness of 50 μm.

A conductive paste for an internal electrode was printed on the green sheet. As the conductive paste, an Ag70%-Pd30% alloy (Ag/Pd=2.33) paste was used. Nine of the green sheets coated with the conductive paste were stacked to provide a multilayered body. The multilayered body was fired under the condition of 1,210° C. for 4 hours to provide a sintered body.

The composition of the piezoelectric material portion of the sintered body was evaluated by ICP, and as a result, it was found that each of the Na, Ba, Nb, Ti, Mn, and Bi elements was contained in the piezoelectric material portion at substantially the same ratio as in the intended composition. Components (excluding O) other than Na, Ba, Nb, Ti, Mn, and Bi accounted for less than 0.2 mol %. The content of each of Pb, K, Mg, and Cu in the piezoelectric material portion of the sintered body was 1,000 ppm or less.

The piezoelectric material portion of the sintered body was cut out and powdered, and subjected to X-ray diffraction measurement of 2θ-θ with Cu—Kα rays at room temperature. It was able to be confirmed that the sample was substantially formed of a single phase of a perovskite structure, and it was found that the perovskite structure had a unit cell having a structure containing two oxygen octahedra. In addition, it was found that the perovskite structure had a P4bm structure. In the 2θ range of from 44° to 48°, two peaks were able to be confirmed, and the largest peak was located on a high-angle side. The ratio I1/I2 of the largest peak intensity I1 to the next largest peak intensity I2 was 1.21. In addition, the average grain diameter on the surface of the piezoelectric material portion of the sintered body was 2.5 μm.

The sintered body was cut to a size of 10 mm×2.5 mm, and then the cut surface was polished. A pair of external electrodes for short-circuiting the internal electrodes alternately was formed by Au sputtering to produce the multilayered piezoelectric element as illustrated in FIG. 2B. The multilayered piezoelectric element includes nine piezoelectric material layers and eight internal electrodes.

The multilayered piezoelectric element was subjected to polarization treatment by immersing the multilayered piezoelectric element in a silicone oil at 150° C. and applying an electric field of 2.4 kV/mm between the two external electrodes for 30 minutes. The resultant multilayered piezoelectric element was evaluated, and as a result, it was found that the multilayered piezoelectric element had a sufficient insulation property, and a satisfactory piezoelectric constant and mechanical quality factor comparable to those of the piezoelectric elements of Example 1 were obtained. In addition, the dielectric loss tangent was so small as to be comparable to that of the piezoelectric elements of Example 1.

Example 34

Through the use of the piezoelectric element of Example 1, the liquid ejection head illustrated in FIG. 3A was produced. It was confirmed that ink was ejected in accordance with an input electric signal.

Example 35

Through the use of the liquid ejection head of Example 34, the liquid ejection apparatus illustrated in FIG. 3B was produced. It was confirmed that ink was ejected onto a recording medium in accordance with an input electric signal.

Example 36

Through the use of the multilayered piezoelectric element of Example 33, the liquid ejection head illustrated in FIG. 3A was produced. It was confirmed that ink was ejected in accordance with an input electric signal.

Example 37

Through the use of the liquid ejection head of Example 36, the liquid ejection apparatus illustrated in FIG. 3B was produced. It was confirmed that ink was ejected onto a recording medium in accordance with an input electric signal.

Example 38

Through the use of the piezoelectric element of Example 1, the oscillatory wave motor illustrated in FIG. 4A was produced. It was confirmed that the motor rotated in accordance with an applied alternating voltage.

Example 39

Through the use of the oscillatory wave motor of Example 38, the optical equipment illustrated in FIG. 4C, FIG. 4D, and FIG. 4E was produced. It was confirmed that automatic focus operation was performed in accordance with an applied alternating voltage.

Example 40

Through the use of the multilayered piezoelectric element of Example 33, the oscillatory wave motor illustrated in FIG. 4B was produced. It was confirmed that the motor rotated in accordance with an applied alternating voltage.

Example 41

Through the use of the oscillatory wave motor of Example 40, the optical equipment illustrated in FIG. 4C, FIG. 4D, and FIG. 4E was produced. It was confirmed that automatic focus operation was performed in accordance with an applied alternating voltage.

Example 42

Through the use of the piezoelectric element of Example 1, the dust removing apparatus illustrated in FIG. 5A and FIG. 5B was produced. Plastic beads were scattered and an alternating voltage was applied, and as a result, satisfactory dust removing efficiency was obtained.

Example 43

Through the use of the dust removing apparatus of Example 42, the image pickup apparatus illustrated in FIG.

5C and FIG. 5D was produced. The image pickup apparatus was operated. As a result, dust on the surface of the image pickup unit was satisfactorily removed, and an image without a dust defect was obtained.

Example 44

Through the use of the multilayered piezoelectric element of Example 33, the dust removing apparatus illustrated in FIG. 5A and FIG. 5B was produced. Plastic beads were scattered and an alternating voltage was applied, and as a result, satisfactory dust removing efficiency was obtained.

Example 45

Through the use of the dust removing apparatus of Example 44, the image pickup apparatus illustrated in FIG. 5C and FIG. 5D was produced. The image pickup apparatus was operated. As a result, dust on the surface of the image pickup unit was satisfactorily removed, and an image without a dust defect was obtained.

According to at least one embodiment of the present disclosure, the novel piezoelectric material having a satisfactory piezoelectric constant and a satisfactory mechanical quality factor, and having a reduced dielectric loss tangent can be provided. According to at least one embodiment of the present disclosure, the piezoelectric element and the electronic equipment each using the piezoelectric material can be provided.

In addition, the piezoelectric material to be used for the electronic equipment according to at least one embodiment of the present disclosure does not use lead and potassium, and hence has a small load on the environment and is also excellent in manufacturability.

The piezoelectric material according to at least one embodiment of the present disclosure can be utilized for a piezoelectric device required to achieve both a large piezoelectric constant and a large mechanical quality factor while being reduced in dielectric loss tangent. In addition, the piezoelectric material according to at least one embodiment of the present disclosure is free of lead, and hence has a small load on the environment. Accordingly, the piezoelectric material according to at least one embodiment of the present disclosure can be utilized without any problem even for a device using a large amount of piezoelectric material, such as a liquid ejection head, an oscillatory wave motor, or a dust removing apparatus.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A piezoelectric material comprising:
a perovskite-type metal oxide represented by the following general formula (1):

$$Na_{x+s(1-y)}(Bi_wBa_{1-s-w})_{1-y}Nb_yTi_{1-y}O_3 \qquad \text{General Formula (1)}$$

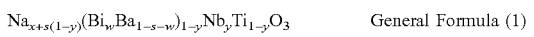

where $0.84 \leq x \leq 0.92$, $0.84 \leq y \leq 0.92$, $0.002 \leq (w+s)(1-y) \leq 0.035$, and $0.9 \leq w/s \leq 1.1$; and
Mn,
wherein a content of the Mn is 0.01 mol % or more and 1.00 mol % or less with respect to the perovskite-type metal oxide.

2. The piezoelectric material according to claim 1, wherein a unit cell of the perovskite-type metal oxide has a structure containing at least two oxygen octahedra.

3. The piezoelectric material according to claim 1, wherein, when a largest peak intensity in a 2θ range of from 44° to 48° in a case in which the piezoelectric material is powdered and subjected to X-ray diffraction measurement of 2θ-θ with Cu—Kα rays at room temperature is represented by I1 and a next largest peak intensity therein is represented by I2, a largest peak is located on a wide-angle side and a relationship of $1.1 \leq I1/I2 \leq 1.3$ is satisfied.

4. The piezoelectric material according to claim 1, wherein the piezoelectric material has a Curie temperature of 200° C. or more.

5. The piezoelectric material according to claim 1, wherein a content of each of Pb, K, Mg, and Cu is 1,000 ppm or less.

6. A manufacturing method for a piezoelectric material comprising firing mixed raw material powder including sodium niobate, barium titanate, and sodium bismuth titanate each having a perovskite-type structure to obtain a sintered body,
the mixed raw material powder being prepared so that:
the piezoelectric material includes:
a perovskite-type metal oxide represented by the following general formula (1):

$$Na_{x+s(1-y)}(Bi_wBa_{1-s-w})_{1-y}Nb_yTi_{1-y}O_3 \qquad \text{General Formula (1)}$$

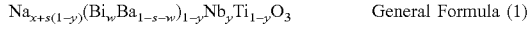

where $0.84 \leq x \leq 0.92$, $0.84 \leq y \leq 0.92$, $0.002 \leq (w+s)(1-y) \leq 0.035$, and $0.9 \leq w/s \leq 1.1$; and
Mn; and
a content of the Mn is 0.01 mol % or more and 1.00 mol % or less with respect to the perovskite-type metal oxide.

7. A piezoelectric element comprising:
an electrode; and
a piezoelectric material portion,
wherein a piezoelectric material for forming the piezoelectric material portion is the piezoelectric material of claim 1.

8. The piezoelectric element according to claim 7, wherein the electrode and the piezoelectric material portion are stacked alternately.

9. A liquid ejection head comprising at least:
a liquid chamber including a vibration unit including the piezoelectric element of claim 7; and
an ejection port communicating to the liquid chamber.

10. A liquid ejection apparatus comprising:
a stage configured to receive an object; and
the liquid ejection head of claim 9.

11. An oscillatory wave motor comprising at least:
a vibration body including the piezoelectric element of claim 7; and
a moving body to be brought into contact with the vibration body.

12. An optical equipment comprising a drive unit including the oscillatory wave motor of claim 11.

13. A vibration device comprising a vibration body including a diaphragm including the piezoelectric element of claim 7.

14. A dust removing apparatus comprising the vibration device of claim 13.

15. An image pickup apparatus comprising at least:
the dust removing apparatus of claim 14; and
an image pickup element unit, wherein the diaphragm of the dust removing apparatus is arranged on a light receiving surface of the image pickup element unit.

16. An electronic equipment comprising the piezoelectric element of claim 7.

* * * * *